United States Patent
Clark et al.

(10) Patent No.: US 11,456,212 B2
(45) Date of Patent: Sep. 27, 2022

(54) PLATFORM AND METHOD OF OPERATING FOR INTEGRATED END-TO-END FULLY SELF-ALIGNED INTERCONNECT PROCESS

(71) Applicant: Tokyo Electron Limited, Tokyo (JP)

(72) Inventors: Robert Clark, Fremont, CA (US); Kandabara Tapily, Albany, NY (US); Kai-Hung Yu, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 14 days.

(21) Appl. No.: 17/135,136

(22) Filed: Dec. 28, 2020

(65) Prior Publication Data

US 2021/0118730 A1 Apr. 22, 2021

Related U.S. Application Data

(62) Division of application No. 16/357,724, filed on Mar. 19, 2019, now Pat. No. 10,923,394.

(Continued)

(51) Int. Cl.
*H01L 21/768* (2006.01)
*H01L 21/67* (2006.01)
(Continued)

(52) U.S. Cl.
CPC ...... *H01L 21/76879* (2013.01); *G05B 13/027* (2013.01); *G05B 19/41875* (2013.01);
(Continued)

(58) Field of Classification Search
None
See application file for complete search history.

(56) References Cited

U.S. PATENT DOCUMENTS

| 9,748,169 B1 | 8/2017 | Murray et al. |
| 10,529,618 B2 * | 1/2020 | Lu ............... H01L 21/7684 |

(Continued)

FOREIGN PATENT DOCUMENTS

| WO | 2017/105447 A1 | 6/2017 |
| WO | 2017/165206 A1 | 9/2017 |

OTHER PUBLICATIONS

International Search Report and Written Opinion dated Jul. 3, 2019 in International Application No. PCT/US2019/022882.

*Primary Examiner* — Bradley Smith
(74) *Attorney, Agent, or Firm* — Oblon, McClelland, Maier & Neustadt, L.L.P.

(57) ABSTRACT

A method for forming a fully self-aligned via is provided. A workpiece having a pattern of features in a dielectric layer is received into a common manufacturing platform. Metal caps are deposited on the metal features, and a barrier layer is deposited on the metal caps. A first dielectric layer is added to exposed dielectric material. The barrier layer is removed and an etch stop layer is added on the exposed surfaces of the first dielectric layer and the metal caps. Additional dielectric material is added on top of the etch stop layer, then both the additional dielectric material and a portion of the etch stop layer are etched to form a feature to be filled with metal material. An integrated sequence of processing steps is executed within one or more common manufacturing platforms to provide controlled environments. Transfer modules transfer the workpiece between processing modules within and between controlled environments.

7 Claims, 17 Drawing Sheets

Related U.S. Application Data

(60) Provisional application No. 62/788,195, filed on Jan. 4, 2019, provisional application No. 62/787,607, filed on Jan. 2, 2019, provisional application No. 62/787,608, filed on Jan. 2, 2019, provisional application No. 62/645,685, filed on Mar. 20, 2018.

(51) Int. Cl.

| | | |
|---|---|---|
| *H01L 21/66* | (2006.01) | |
| *H01L 21/677* | (2006.01) | |
| *H01L 21/02* | (2006.01) | |
| *H01L 21/285* | (2006.01) | |
| *H01L 21/311* | (2006.01) | |
| *G05B 13/02* | (2006.01) | |
| *G05B 19/418* | (2006.01) | |
| *C23C 14/24* | (2006.01) | |
| *C23C 14/34* | (2006.01) | |
| *H01J 37/32* | (2006.01) | |

(52) U.S. Cl.
CPC .... *H01L 21/0228* (2013.01); *H01L 21/02271* (2013.01); *H01L 21/28562* (2013.01); *H01L 21/31116* (2013.01); *H01L 21/67023* (2013.01); *H01L 21/67063* (2013.01); *H01L 21/67161* (2013.01); *H01L 21/67167* (2013.01); *H01L 21/67184* (2013.01); *H01L 21/67196* (2013.01); *H01L 21/67225* (2013.01); *H01L 21/67253* (2013.01); *H01L 21/67276* (2013.01); *H01L 21/67288* (2013.01); *H01L 21/67703* (2013.01); *H01L 21/67742* (2013.01); *H01L 21/67745* (2013.01); *H01L 21/7685* (2013.01); *H01L 21/76802* (2013.01); *H01L 21/76831* (2013.01); *H01L 21/76832* (2013.01); *H01L 21/76834* (2013.01); *H01L 21/76897* (2013.01); *H01L 22/12* (2013.01); *C23C 14/24* (2013.01); *C23C 14/34* (2013.01); *G05B 2219/32368* (2013.01); *G05B 2219/45031* (2013.01); *H01J 37/32* (2013.01); *H01L 21/67017* (2013.01); *H01L 21/67207* (2013.01)

(56) References Cited

U.S. PATENT DOCUMENTS

| | | | |
|---|---|---|---|
| 11,031,287 B2 * | 6/2021 | Tapily | H01L 21/76897 |
| 2015/0091181 A1 | 4/2015 | Li et al. | |
| 2017/0110397 A1 | 4/2017 | Wu et al. | |
| 2017/0207121 A1 | 7/2017 | Anderson et al. | |
| 2017/0294348 A1 | 10/2017 | Mebarki et al. | |
| 2019/0295890 A1 | 9/2019 | Clark et al. | |

\* cited by examiner

PLATFORM AND METHOD OF OPERATING FOR INTEGRATED END-TO-END FULLY SELF-ALIGNED INTERCONNECT PROCESS

CROSS-REFERENCE TO RELATED APPLICATIONS

This application is a divisional application of U.S. patent application Ser. No. 16/357,724 filed on Mar. 19, 2019, which claims the benefit of U.S. Provisional Application No. 62/645,685, filed on Mar. 20, 2018, entitled "Substrate Processing Tool with Integrated Metrology and Method of Using," U.S. Provisional Application No. 62/787,607, filed on Jan. 2, 2019, entitled "Self-Aware and Correcting Heterogeneous Platform incorporating Integrated Semiconductor Processing Modules and Method for using same," U.S. Provisional Application No. 62/787,608, filed on Jan. 2, 2019, entitled "Self-Aware and Correcting Heterogeneous Platform incorporating Integrated Semiconductor Processing Modules and Method for using same," and U.S. Provisional Application No. 62/788,195, filed on Jan. 4, 2019, entitled "Substrate Processing Tool with Integrated Metrology and Method of using." The entire contents of the above-identified applications are incorporated herein by reference in their entirety.

BACKGROUND OF THE INVENTION

Field of Invention

The present invention relates to a processing platform and methods for semiconductor processing using the platform, and more particularly to a method of forming a fully self-aligned via (FSAV).

Description of Related Art

Recess shape formation techniques have been used for formation of vias on transistor wafers, and the like. Dimension shrinkage is one of the driving forces in the development of integrated circuit processing. By reducing the size dimensions, cost-benefit and device performance boosts can be obtained. This scalability creates inevitable complexity in process flow, especially on patterning techniques. As smaller transistors are manufactured, the critical dimension (CD) or resolution of patterned features is becoming more challenging to produce, particularly in high volume. Self-aligned patterning needs to replace overlay-driven patterning so that cost-effective scaling can continue. Patterning options that enable reduced variability, extend scaling, and enhance CD and process control are needed in a high-volume manufacturing environment; however, it is getting extremely difficult to produce scaled devices at reasonably low cost and high yield.

As devices are scaled to smaller and smaller features and techniques are implemented to try and address the issues that result from scaling, it is important to monitor the fabrication process at various stages of the process flow to determine whether the feature attributes are within specification, and if not, to adjust the process to either bring the workpiece within specification or to bring subsequently processed workpieces within specification.

In conventional via fabrication, the process is performed using multiple separate stand-alone tools for high-volume manufacturing. Wafers are sequentially loaded into one tool, subjected to one process step in that tool, then removed to ambient environment and placed in queue to be loaded into the next tool, and so on until the multiple steps of the via fabrication flow are complete. Time spent waiting in queue for each tool is referred to as Q-time, and high Q-times result in lower production rates. Different operations in the process flow may take different amounts of time such that throughput matching of tools is a production challenge.

Further, in conventional via fabrication, the distance from corner-to-corner of adjacent metal features may be too small for the semiconductor to operate properly. For example, too small of a distance from corner-to-corner of adjacent metal features may result in the semiconductor shorting in operation. Increasing the metal feature corner-to-corner distance allows the semiconductor to successfully operate more consistently.

Each tool in the process flow may be part of a tool cluster. For example, five identical etch tools can be clustered in combination with a transfer tool so that 5 wafers can be etched concurrently at one step of the process flow to enable high-volume production. The multiplicity of these cluster tools provides a benefit if a tool goes out of service for any reason. If 1 tool in a 5-tool cluster goes out of service for 1 week, then production can continue, albeit at only 80% capacity. Thus, each stand-alone tool in the SAMP flow may be a cluster of identical tools to prevent an out of service tool from shutting down production completely, and clustering may be used to minimize throughput matching challenges.

Additionally, semiconductors with fully self-aligned vias improve the time dependent dielectric breakdown (TDDB) of the semiconductor. TDDB is a reliability metric for the amount of time to breakdown dielectric material under normal operating conditions (e.g., electric field exposure). TDDB performance can be optimized based on the device layout (e.g., dielectric material type, dielectric thickness, metal line placement with respect to the dielectric material) and operating conditions (e.g. voltage, frequency) to maintain electrical isolation between metal features in a device. For example, repeated low-level exposure to electric fields during normal operation may alter the electrical properties of the dielectric material over a period of time. TDDB quantifies the amount of time for dielectric breakdown to occur. The fully self-aligned via techniques described herein may increase TDDB by altering the layout by increasing the distance between the vias and the underlying metal lines. For example, the FSAV techniques can increase isolation by narrowing the contact portion of the via to increase the amount of dielectric material between the vias and adjacent metal lines.

Thus, the conventional approach of using multiple separate stand-alone tools (single or clustered) for high-volume manufacturing can lead to issues including but not limited to Q-time oxidation (i.e., as the wafers sit between tools waiting for their turn in the next tool, they can be subjected to oxidation from the ambient environment), defectivity from environmental exposure between tools, cost challenges due to throughput matching difficulties, temporal tool drift (e.g., EPE), real time chamber matching (e.g., yield and EPE), and lack of real-time workpiece measurement and process control. There is a need to address these and other issues, such as shorting of integrated circuits, to enable high-volume manufacturing with via fabrication techniques.

SUMMARY OF THE INVENTION

A method of preparing for a self-aligned via on a semiconductor workpiece is provided using an integrated sequence of processing steps executed on a common manufacturing platform hosting a plurality of processing modules including one or more film-forming modules, one or more etching modules, and one or more transfer modules. In one embodiment, the integrated sequence of processing steps includes receiving the workpiece into the common manufacturing platform, the workpiece having a pattern of metal features in a dielectric layer wherein exposed surfaces of the metal features and exposed surfaces of the dielectric layer together define an upper planar surface. Next, metal caps are selectively deposited on the exposed surfaces of the metal features relative to the exposed dielectric material using one of the one or more of the film-forming modules. Then, a barrier layer is selectively formed on the metal caps, using one of the one or more film-forming modules, relative to the exposed dielectric material. A first dielectric material is selectively deposited on the exposed surfaces of the dielectric layer using one of the one or more film-forming modules to form a recess pattern in the first dielectric material, the selective deposition being based, at least in part, on a deposition rate of the first dielectric material being higher on the exposed surfaces than on the metal caps, the recess pattern comprising a sidewall including a portion of the first dielectric material. Then, the workpiece is treated to expose the metal caps at bottom surfaces of the recess pattern using one of the one or more etch modules. Next, an etch stop layer is deposited over the recess pattern using one of the one or more film-forming modules. The integrated sequence of processing steps is executed in a controlled environment within the common manufacturing platform and without leaving the controlled environment, and wherein the one or more transfer modules are used to transfer the workpiece between the plurality of processing modules while maintaining the workpiece within the controlled environment. Thereafter, one or more self-aligned vias can be formed on the semiconductor workpiece, such as using other modules and/or common manufacturing platforms.

In another embodiment, the integrated sequence of processing steps includes receiving the workpiece into the common manufacturing platform, the workpiece having a pattern of metal features in a dielectric layer wherein exposed surfaces of the metal features and exposed surfaces of the dielectric layer together define an upper planar surface. Then, the metal features are selectively etched to form a recess pattern by recessing the exposed surfaces of the metal features beneath the exposed surfaces of the dielectric layer using one of the one or more etching modules. Next, an etch stop layer is deposited over the recess pattern using one of the one or more film-forming modules. The integrated sequence of processing steps is executed in a controlled environment within the common manufacturing platform and without leaving the controlled environment, and wherein the one or more transfer modules are used to transfer the workpiece between the plurality of processing modules while maintaining the workpiece within the controlled environment. Thereafter, one or more self-aligned vias can be formed on the semiconductor workpiece, such as using other modules and/or common manufacturing platforms.

In yet another embodiment, the integrated sequence of processing steps includes receiving the workpiece into the common manufacturing platform, the workpiece having a pattern of metal features in a dielectric layer wherein exposed surfaces of the metal features and exposed surfaces of the dielectric layer together define an upper planar surface. Then, metal caps are selectively deposited on the exposed surfaces of the metal features relative to the exposed dielectric material using one of the one or more of the film-forming modules. Next, a recessed pattern of dielectric material is selectively formed around the metal features relative to the dielectric material, with the metal caps forming a bottom surface of the recessed pattern, the metal caps being exposed from the top of the trench. Then, an etch stop layer is deposited over the recess pattern using one of the one or more film-forming modules. The integrated sequence of processing steps is executed in a controlled environment within the common manufacturing platform and without leaving the controlled environment, and wherein the one or more transfer modules are used to transfer the workpiece between the plurality of processing modules while maintaining the workpiece within the controlled environment. Thereafter, one or more self-aligned vias can be formed on the semiconductor workpiece, such as using other modules and/or common manufacturing platforms.

In a related embodiment, the methods can be continued to include obtaining real-time measurement data related to one or more attributes of the workpiece in a workpiece measurement region located within a dedicated area of at least one of the one or more transfer modules or located within a metrology module(s) hosted on one or more common manufacturing platforms. And a remedial action can be implemented to ameliorate the non-conformity when the measurement data indicates the non-conformity is present on the workpiece.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Figure 1A:
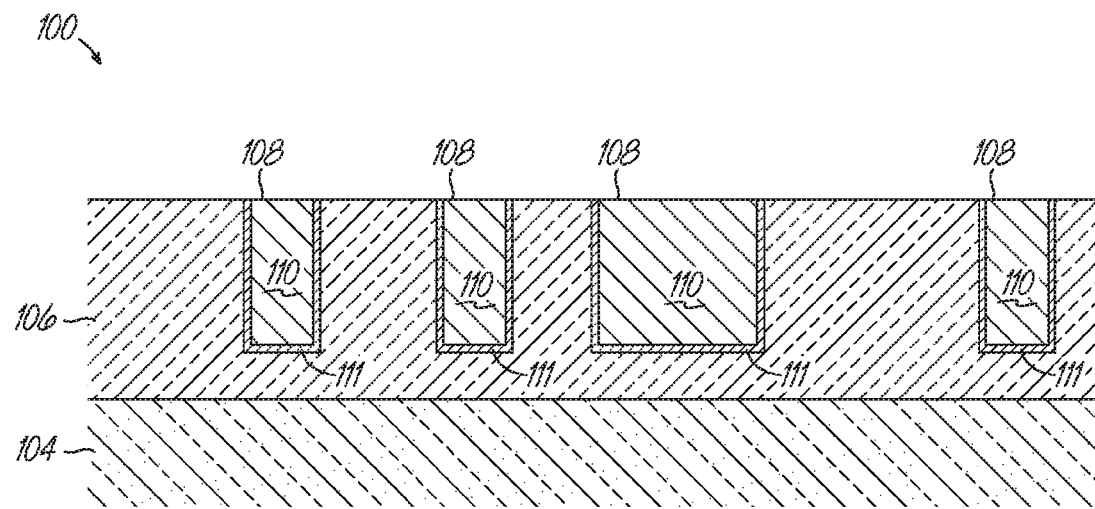
FIGS. 1A-1M are schematic cross-sectional diagrams illustrating one embodiment of a fully self-aligned via formation method.

Methods using an integrated platform for fully self-aligned via formation are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention but does not denote that it is present in every embodiment. Thus, the phrases such as "in one embodiment" or "in an embodiment" that may appear in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOT") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein the term "workpiece" means a composition of materials or layers formed on a substrate during one or more phases of a semiconductor device manufacturing process, the workpiece ultimately comprising the semiconductor device at a final stage of processing.

The present embodiments include methods for fully self-aligned via formation that utilize one or more common manufacturing platforms in which multiple processing steps are performed on each of the common manufacturing platforms within their own controlled environment, for example, without breaking vacuum between operations. An integrated end-to-end platform may include both etching modules and film-forming modules and is configured to transfer a workpiece from one module to another while maintaining the workpiece in a controlled environment, e.g., without breaking vacuum or leaving an inert gas protective environment, and thus avoiding exposure to an ambient environment. Any fully self-aligned via formation process may include steps performed on the common manufacturing platform, and the integrated end-to-end platform will enable high-volume manufacturing at reduced cost with improvement to yield, defectivity levels and EPE.

As used herein, a "film-forming module" refers to any type of processing tool for depositing or growing a film or layer on a workpiece in a process chamber. The film-forming module may be a single wafer tool, a batch processing tool, or a semi-batch processing tool. The types of film deposition or growth that may be performed in the film-forming module include, by way of example and not limitation, chemical vapor deposition, plasma-enhanced or plasma-assisted chemical vapor deposition, atomic layer deposition, physical vapor deposition, thermal oxidation or nitridation, elevated temperature deposition, etc., and the process may be isotropic, anisotropic, conformal, selective, blanket, etc.

As used herein, an "etching module" refers to any type of processing tool for removing all or a portion of a film, layer, residue or contaminant on a workpiece in a process chamber. The etching module may be a single wafer tool, a batch processing tool, or a semi-batch processing tool. The types of etching that may be performed in the etching module include, by way of example and not limitation, chemical oxide removal (COR), dry (plasma) etching, reactive ion etching, wet etching using immersion or non-immersion techniques, atomic layer etching, chemical-mechanical polishing, cleaning, ashing, lithography, etc., and the process may be isotropic, anisotropic, selective, etc.

As used herein, "module" generally refers to a processing tool with all of its hardware and software collectively, including the process chamber, substrate holder and movement mechanisms, gas supply and distribution systems, pumping systems, electrical systems and controllers, etc. Such details of the modules are known in the art and therefore not discussed herein.

As used herein, "controlled environment" as used herein refers to an environment in which the ambient atmosphere is evacuated and either replaced with a purified inert gas or a low-pressure vacuum environment. A vacuum environment is well below atmospheric pressure and is generally understood to be $10^{-5}$ Torr or less, for example $5 \times 10^{-8}$ Torr or less. However, the controlled environment may include any sub-atmospheric pressure environment within the processing tool that is isolated from ambient air conditions or environments greater than atmospheric pressure. Further, the controlled environment within the processing tool is not required to be a constant pressure, or the same pressure, within each portion of the processing tool. For example, pressure within the controlled environment may vary within each chamber of the processing tool at different times to enable different processing conditions within a respective chamber or minimize pressure differentials between two or more chambers when substrates are transferred between chambers.

Reference is now made to the drawings, where like reference numerals designate identical or corresponding parts throughout the several views.

Figure 2:
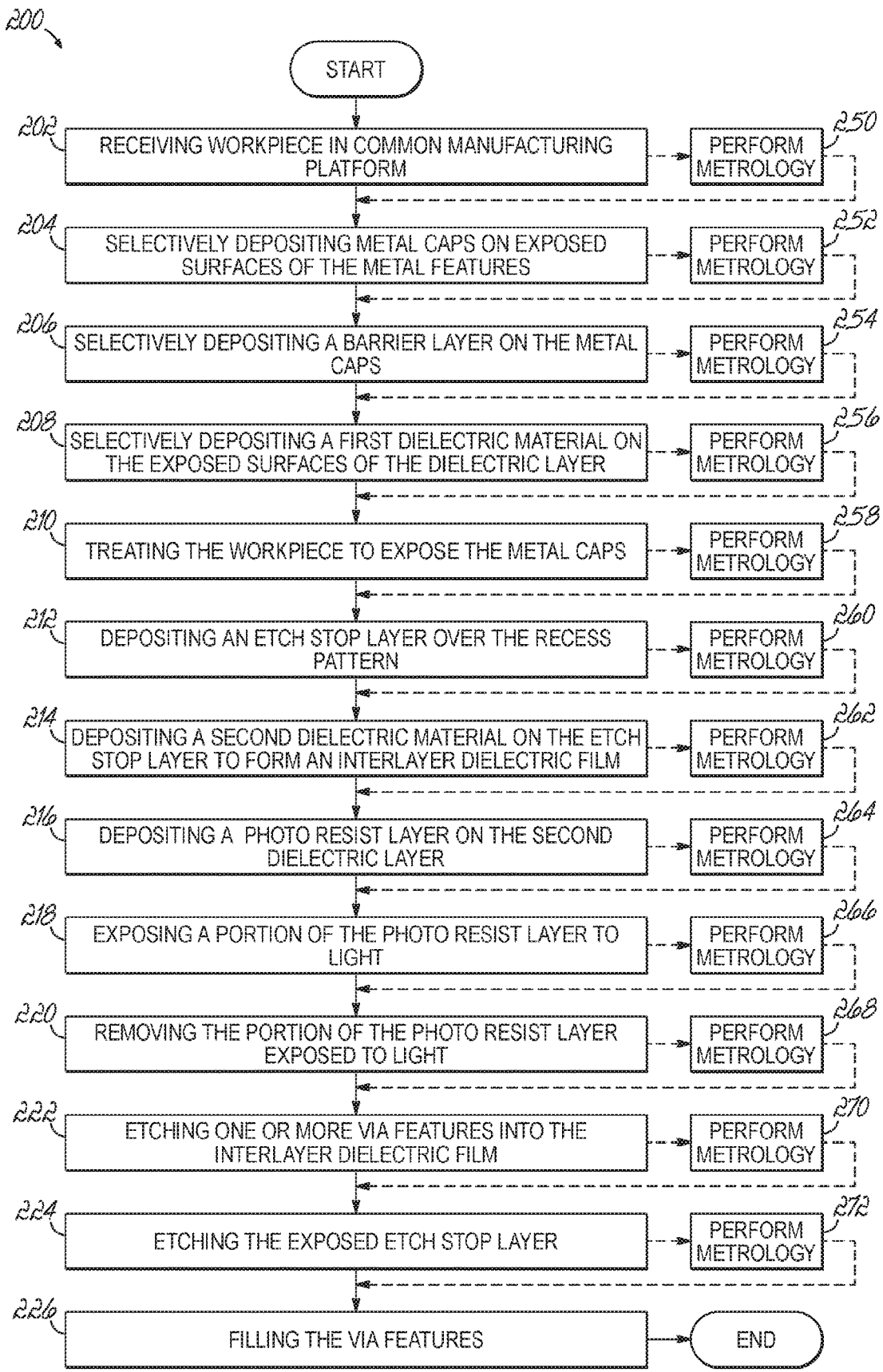
FIG. 2 is a flow chart diagram illustrating one embodiment of an integrated process flow for fully self-aligned via formation.
Figure 3:
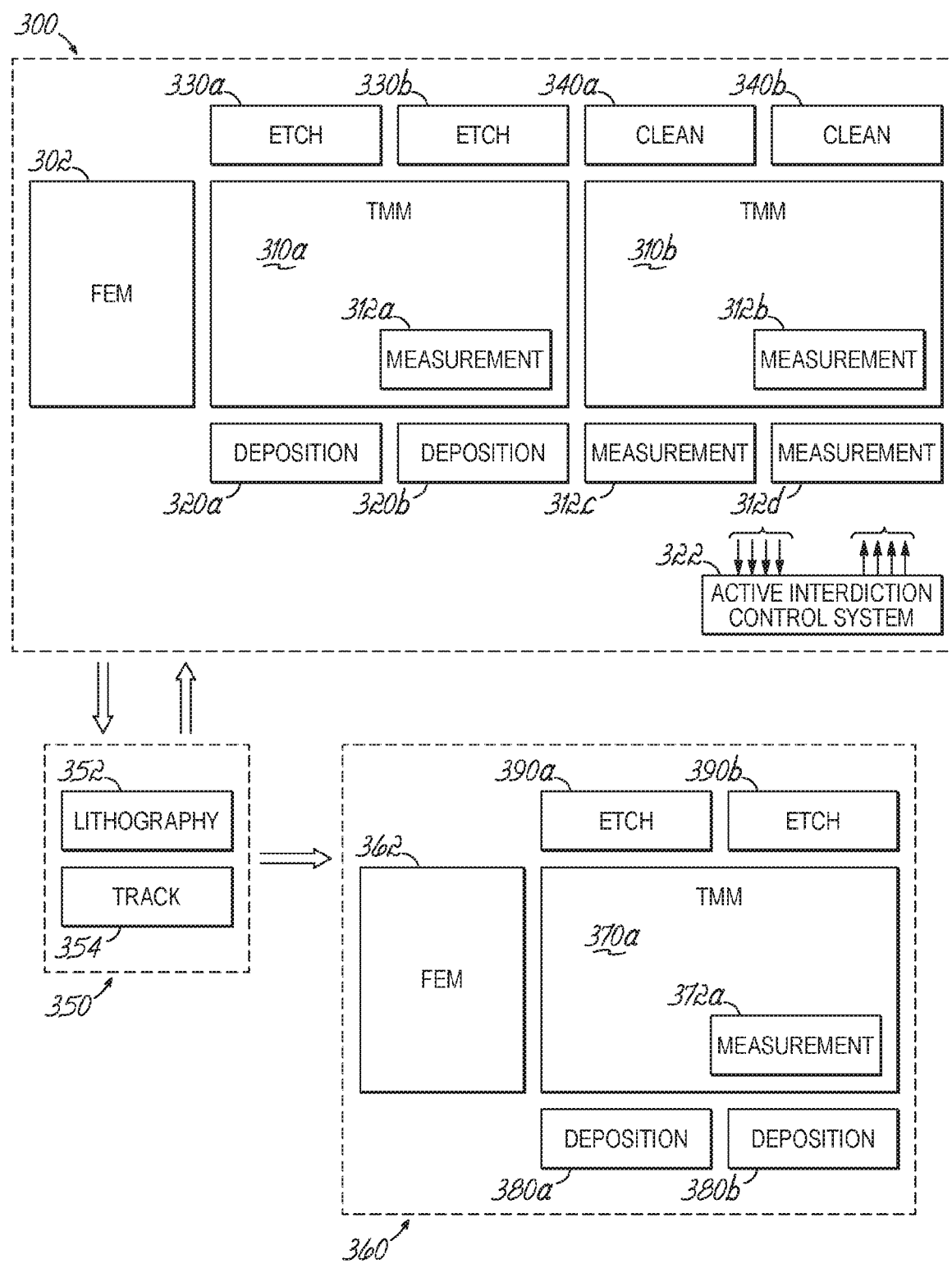
FIG. 3 is a schematic diagram illustrating one embodiment of a common manufacturing platform for performing a fully self-aligned via formation method.
Figure 4A:
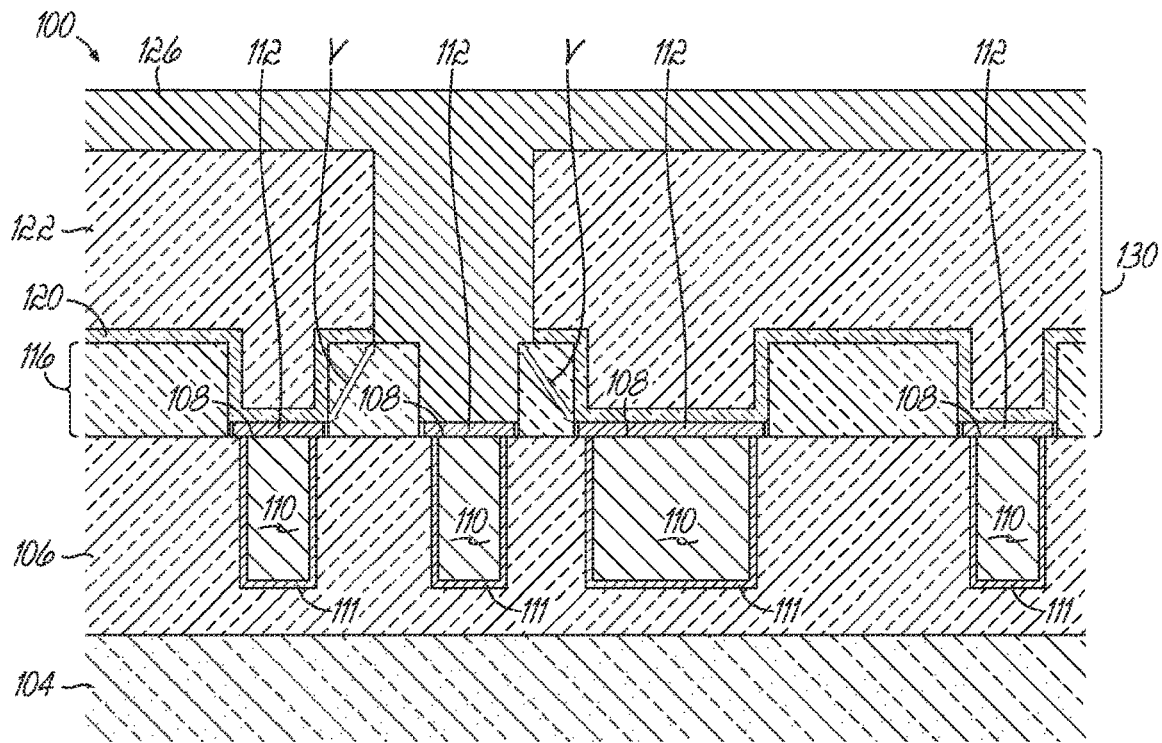
FIGS. 4A-4B are schematic cross-sectional diagram comparing conventional filled features with fully self-aligned via features.
Figure 4B:
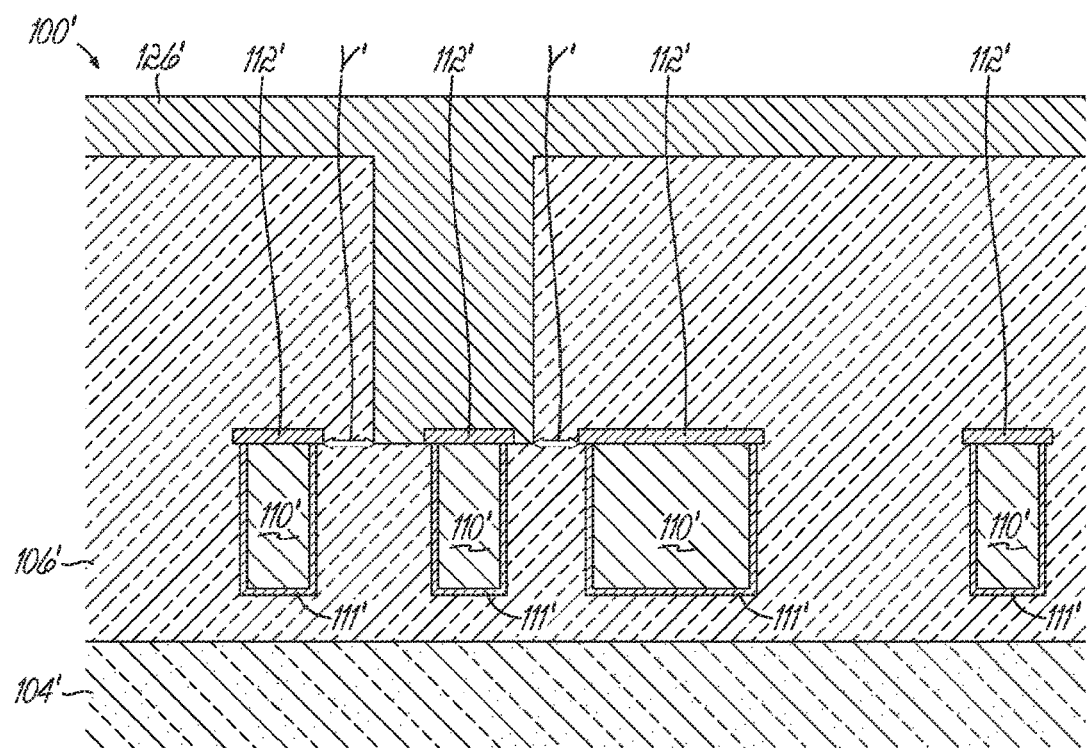

FIGS. 1A-1M illustrate schematic cross-sectional diagrams illustrating one embodiment of a fully self-aligned via formation method for a workpiece 100. FIG. 2 is a flow chart of a process flow 200 corresponding to the method of FIGS. 1A-1M. FIG. 3 illustrates an embodiment of an arrangement of a first common manufacturing platform 300 together with an ancillary module 350 and a second common manufacturing platform 360 of the invention that may be used for performing process flow 200. FIGS. 4A and 4B are an illustration of a resulting benefit of the workpiece 100. The process flow 200 of FIG. 2 and the first common manufacturing platform 300, second common manufacturing platform 360, and ancillary module 350 of FIG. 3 will be referenced throughout the following sequential discussion of FIGS. 1A-1M in which workpiece 100 is described as it proceeds through a sequence of processing steps.

In operation 202 of process flow 200 and as shown in FIG. 1A, a workpiece 100 having a pattern of metal features 110 in an underlying layer 106 is provided into the first common manufacturing platform 300. The workpiece 100 includes the pattern of metal features 110 and the underlying layer 106 positioned on the substrate 104. To those familiar in the current art, different schemes are known for creating a pattern of metal features 110 on a substrate. For simplicity, workpiece 100 is depicted with a substrate 104 having an underlying layer 106 thereon, although it may be understood that the structure on which the metal features 110 are formed may be a multi-layer structure of which the underlying layer 106 is just one of multiple layers.

The underlying layer 106 may be an oxide layer including silicon oxide, silicon dioxide, a carbon doped silicon oxide, a porous carbon doped silicon oxide, or some other oxide of silicon. In the case of a porous oxide, a pore sealing process may be performed prior to operation 204 (not shown). Alternatively or in addition, the underlying layer 106 may be a dielectric layer.

The metal features 110 may include, but is not limited to copper, ruthenium, cobalt, tungsten, or combinations thereof. Additionally, a liner layer 111 is included in the recessed feature along with the metal material in the metal features 110. The liner layer 111 may include tantalum nitride, and inhibits the metal from contacting the oxide and/or dielectric material in the underlying layer 106. The liner layer 111 may serve to bond the metal material in the metal feature 110 to the underlying layer 106. Alternatively or in addition, the liner layer 111 may serve to prevent the metal material in the metal feature 110 from diffusing into the underlying layer 106.

As shown in FIG. 3, a front end module (FEM) 302 or a transfer module 310a may be used to bring the workpiece into the controlled environment of the first common manufacturing platform 300, which controlled environment is maintained throughout at least a portion of the process flow 200. The controlled environment may include a vacuum environment, where at least some operations in the process flow 200 are conducted in sequence without breaking vacuum, or an inert gas atmosphere, or a combination thereof. A single transfer module may be coupled between each processing module or tool, such as each of transfer modules 310a, 310b shown in FIG. 3, or separate transfer modules may be used for each tool transfer. Transfer modules 310a-b may be collectively referred to herein as transfer modules 310 where appropriate. Where different processing modules on the first common manufacturing platform 300 require different controlled environments, such as different vacuum pressures or vacuum in one module followed by a module with inert gas atmosphere, multiple transfer modules 310 may be used where the transfer modules 310 assist in implementing the transitions between the different controlled environments. While a single transfer module may be useful in a cluster-type tool where same-type processing modules are positioned in a circle around the transfer module, multiple transfer modules 310 may be more appropriate in an end-to-end platform configuration with different processing module types such as that depicted in FIG. 3. However, the embodiments herein do not preclude an end-to-end platform configuration that utilizes a single transfer module that is coupled to each of the processing modules, or some configuration in between, for example, a common transfer module for adjacent same-type processing modules that are used in sequence.

A front-end module 302 may be used to load a cassette of workpieces (not shown), sequentially line up the workpieces and insert them into a load lock, then into a transfer module 310a in a controlled environment, and the transfer module 310a sequentially loads the workpieces into a processing module. In the first common manufacturing platform 300, in operation 202, the workpiece 100, which has been received into the controlled environment, is loaded by the transfer module 310a into a film-forming module 320a or 320b hosted on the first common manufacturing platform 300. Film-forming modules 320a, 320b may be collectively referred to herein as film-forming modules 320 where appropriate. Similarly, etching modules 330a, 330b may be collectively referred to herein as etching modules 330 where appropriate. Similarly, metrology modules 312a-d may be collectively referred to herein as metrology modules 312 where appropriate. Similarly, cleaning modules 340a, 340b may be collectively referred to herein as cleaning modules 340 where appropriate.

Figure 1B:
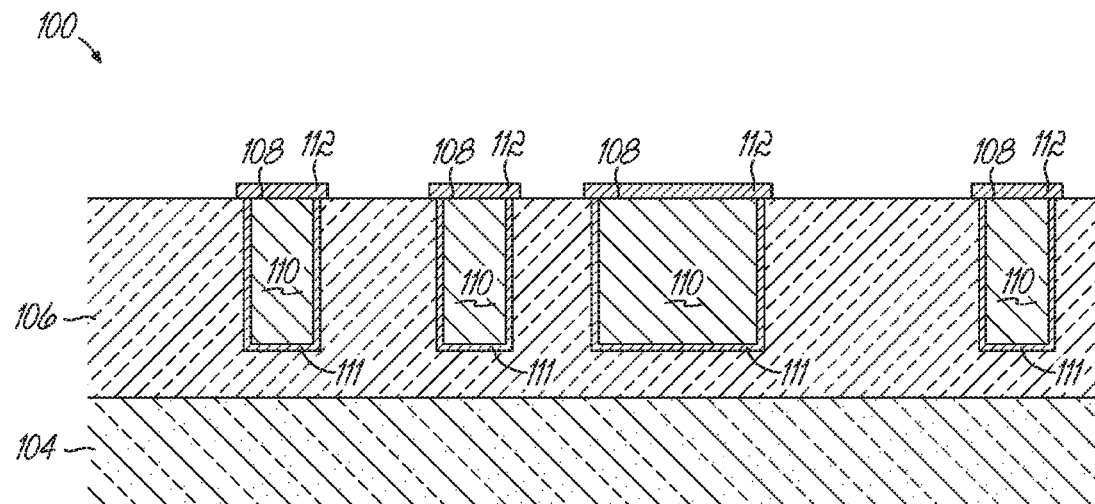

Referring to FIGS. 1B, 2, and 3, in operation 204, in the film-forming module 320, a metal cap 112 is selectively deposited over the exposed surface 108 of the metal features 110. The exposed surfaces 108 of the metal features 110 together with the upper surface of the underlying layer 106 form an upper planar surface of the workpiece 100. The metal cap 112 may include ruthenium, titanium, tungsten, molybdenum, or cobalt. The metal cap 112 selectively is deposited onto the exposed surface 108 of the metal features 110 while simultaneously negligibly bonding to the exposed surface of the underlying layer 106. In one embodiment, the selective application of the metal cap 112 may be based, at least in part, on the selectivity between the metal caps 112 and the dielectric material (e.g., underlying layer 106) being based, at least in part, on a higher metal deposition rate on the metal features 110 than on the dielectric material. In this way, the metal thickness on the exposed surface 108 of the metal features 110 will be thicker than the metal deposited on the dielectric material during one or more steps of the metal deposition process. In some instances, the selectivity between the metal features 110 and the dielectric material may decrease as the metal cap 112 thickness increases due to larger amounts of metal on the dielectric material enables a higher metal deposition rate on the dielectric material. One approach to counter the reduced selectivity is to expose the workpiece to an metal etching process to remove any metal from the dielectric material during the metal cap deposition step. The metal etch process may be implemented in one or more of the etching modules on the common manufacturing platform using a process known to any person of ordinary skill in the art of plasma etching in the semiconductor industry.

In some embodiments, the selectivity between the metal features 110 and the dielectric material can be improved by applying a pre-treatment to the workpiece to alter a surface termination of the first dielectric material, such that the difference in metal cap deposition rate between the metal features 110 and the dielectric material is higher than without the pre-treatment. In this embodiment, the common manufacturing platform may include in one or more pretreatment modules capable of generating a gas or plasma treatment.

As shown in FIG. 3, the first common manufacturing platform 300 may include two identical film-forming modules 320a, 320b on the same side of the transfer module 310a. Alternatively, the film-forming modules 320 may be on opposite sides of the transfer module 310a. By mirroring the two sides of the platform 300, end-to-end processing can be achieved for two workpieces concurrently, and if one film-forming module 320 goes out of service temporarily, the platform 300 can continue to operate, at least at 50% capacity. In some examples, the metal caps 112 selectivity to the metal features 110 relative to the underlying layer 106 is at least 10:1.

Then, without leaving the controlled environment, e.g., without breaking vacuum, transfer modules 310a and 310b may be used to transfer the workpiece 100 to the film-forming module 320 such as first film-forming module 320a also hosted on the first common manufacturing platform 300, e.g., transfer module 310a removes the workpiece 100 from first film-forming module 320a and transfers it to transfer module 310b, which then may redeliver the workpiece 100 into the first film-forming module 320a or to second film-forming module 320b. Adjustments to the controlled environment may be made in transfer modules 310a and 310b if second film-forming module 320b operates with different parameters than first film-forming module 320a, such as different vacuum pressures.

Figure 1C:
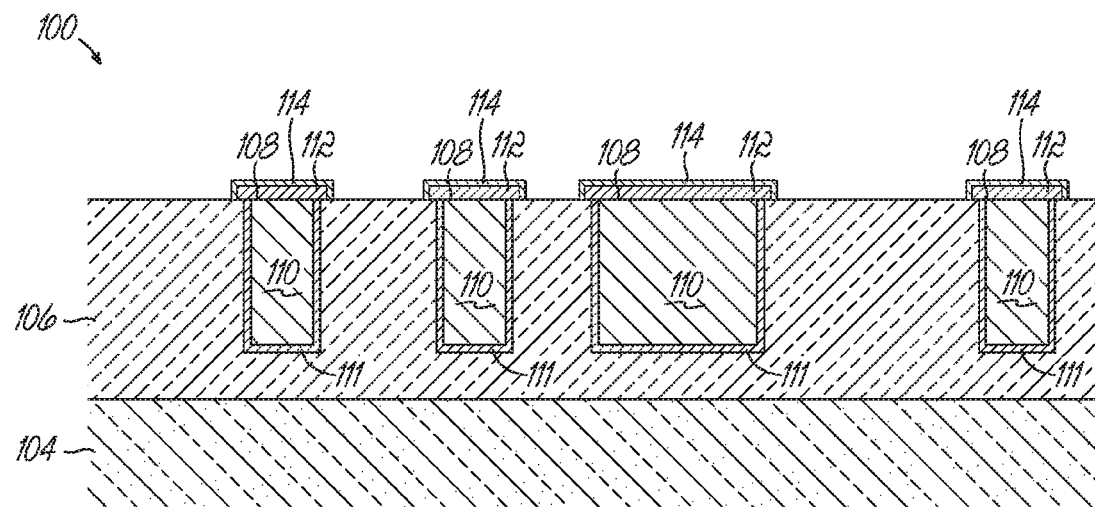

Referring to FIGS. 1C, 2, and 3, in operation 206, a barrier layer 114 is deposited over the metal caps 112 in at least one of the film-forming modules 320 to cover the metal caps 112. In some examples, the barrier layer 114 includes a self-assembled monolayer (SAM). The barrier layer 114 material has an affinity toward the metal caps 112, and thus the barrier layer 114 selectively deposits to cover the metal caps 112 relative to the underlying layer 106. In some examples, the barrier layer 114 encases the metal caps 112 over the metal features 110 and may be deposited in much smaller amounts on the dielectric material (e.g., underlying layer 106) based, at least in part, on the selectivity between the metal cap and the dielectric material being based, at least in part, on a higher barrier layer deposition rate on the metal caps 112 than on the dielectric material. In one embodiment, the difference in deposition rate is derived from the barrier layer 114 material having a higher affinity for the metal caps 112 than the dielectric material.

In some embodiments, the common manufacturing platform may include an etching module to remove the barrier layer 114, in certain instances, using a process known to any person of ordinary skill in the art of plasma etching or semiconductor manufacturing.

Figure 1D:
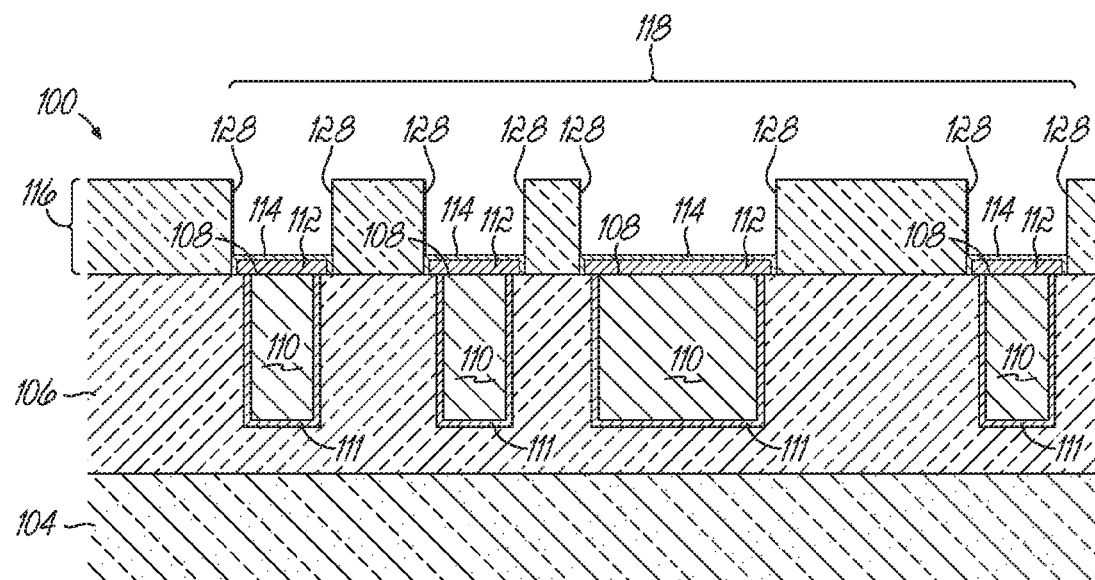

Thereafter, and again without leaving the controlled environment, e.g., without breaking vacuum, in operation 208, with reference to FIGS. 1D, 2, and 3, a first dielectric layer 116 is selectively deposited onto the underlying layer 106. At least due to repulsive interactions between the first dielectric layer 116 material and the barrier layer 114 material, the first dielectric layer 116 bonds less with the barrier layer 114 relative to the underlying layer 106. As a result, the barrier layer 114 shields the metal caps 112 from being exposed to the first dielectric layer 116 material at least during deposition of the first dielectric layer 116. The deposition of the first dielectric layer 116 may occur in any of the film-forming modules 320. For example, the deposition of the first dielectric layer 116 may occur in the same film-forming module 320 as the deposition of the metal caps 112. Alternatively or in addition, the deposition of the first dielectric layer 116 may occur in a different film-forming module 320 than the deposition of the metal caps 112. The first dielectric layer 116 is deposited in such a way as to form a recess pattern 118 in the first dielectric material 116 based, at least in part, on the selective deposition process including two or more deposition steps in which the dielectric material is layered to form the sidewalls 128 of the recessed pattern 118. For example, the selective deposition process may include two or more deposition steps which apply 10 nm or less of the first dielectric material 116 on the workpiece. In this way, etching back the first dielectric layer 116 is avoided at this time at least because the recessed pattern 118 naturally forms at least due to the barrier layer's 114 repulsion of the first dielectric layer 116 material. Alternatively or in addition, the selective deposition of the first dielectric layer is based, at least in part, on a deposition rate of the first dielectric layer 116 material being higher on the exposed surfaces of the underlying layer 106 than on the barrier layer 114. Each of the recessed pattern 118 features includes sidewalls 128. The sidewalls 128 include at least a portion of the first dielectric layer 116 material. The first dielectric layer 116 material may include silicon oxide, silicon dioxide, a carbon doped silicon oxide, a porous carbon doped silicon oxide, or some other oxide of silicon. In some examples, the first dielectric layer 116 material is the same as the underlying layer 106 material. Alternatively, the first dielectric layer 116 is a different material than the underlying layer 106 material.

In some instances, as the thickness of the first dielectric material increases on the barrier layer 114, the selectivity between the barrier layer 114 and the first dielectric material decreases impacting the profile and step-height of the sidewall 128. However, selectivity may be improved by exposing the workpiece to an etching process to remove the dielectric material from the barrier layer 114, without removing all of the first dielectric material 116 on the underlying layer 106. In one embodiment, an etch process, developed by a person of ordinary skill in the art of plasma etching, may be used to remove portions of the first dielectric material 116 from the barrier layer 114. In another embodiment, the etch process may be used to remove the first dielectric material 116 and the barrier layer 114 and expose the metal caps 112. However, before restarting the dielectric deposition process a replacement barrier layer may be selectively applied to the metal caps using a barrier layer deposition process developed by a person of ordinary skill in the art of thin-film deposition.

Then, without leaving the controlled environment, e.g., without breaking vacuum, transfer modules 310a and 310b may be used to transfer the workpiece 100 to the etching module 330 such as first etching module 330a also hosted on the first common manufacturing platform 300, e.g., transfer module 310a removes the workpiece 100 from first film-forming module 320a and transfers it to transfer module 310b, which then may deliver the workpiece 100 into the first etching module 330a. Adjustments to the controlled environment may be made in transfer modules 310a and 310b if etching module 330 operates with different parameters than first film-forming module 320a, such as different vacuum pressures.

Figure 1E:
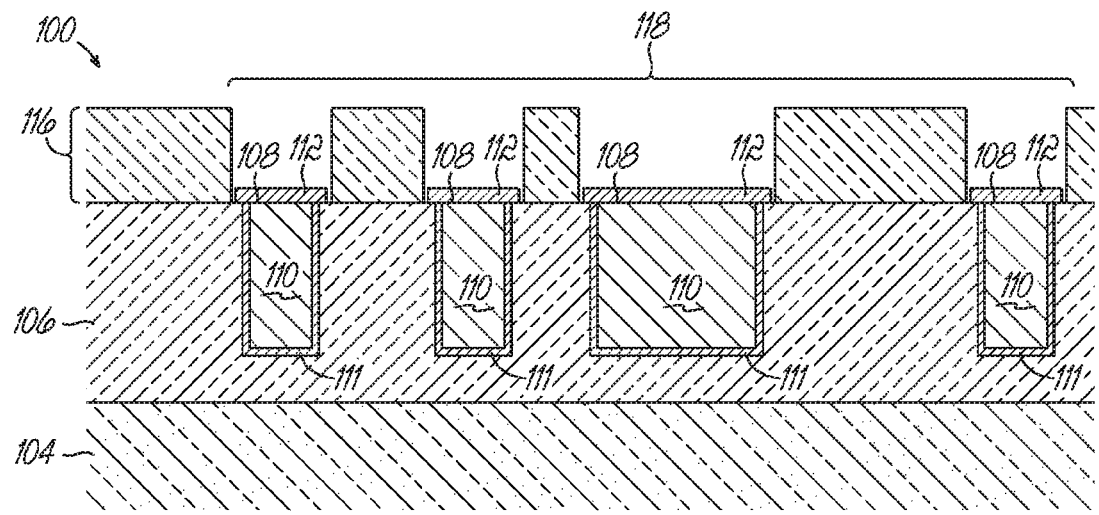

Thereafter, and again without leaving the controlled environment, e.g., without breaking vacuum, in operation 210, with reference to FIGS. 1E, 2, and 3, the workpiece 100 is treated in an etching module 330 to remove the barrier layer 114 from the metal caps 112. The treatment of the workpiece 100 removes the barrier layer 114 from the metal caps 112, exposing the metal caps 112 at a bottom surface of the recessed pattern 118 features, as shown in FIG. 1E. The treatment to remove the barrier layer 114 may include an etch back treatment including etching the barrier layer 114 off of the workpiece 100. The treatment to remove the barrier layer 114 may occur in at least one of the etch modules 330.

Then, without leaving the controlled environment, e.g., without breaking vacuum, transfer modules 310*a* and 310*b* may be used to transfer the workpiece 100 to the film-forming module 320 such as first film-forming module 320*a* also hosted on the first common manufacturing platform 300, e.g., transfer module 310*a* removes the workpiece 100 from first etching module 330*a* and transfers it to transfer module 310*b*, which then may deliver the workpiece 100 into the first film-forming module 320*a* or to second film-forming module 320*b*. Adjustments to the controlled environment may be made in transfer modules 310*a* and 310*b* if the film-forming module 320 operates with different parameters than etching module 330, such as different vacuum pressures.

Figure 1F:
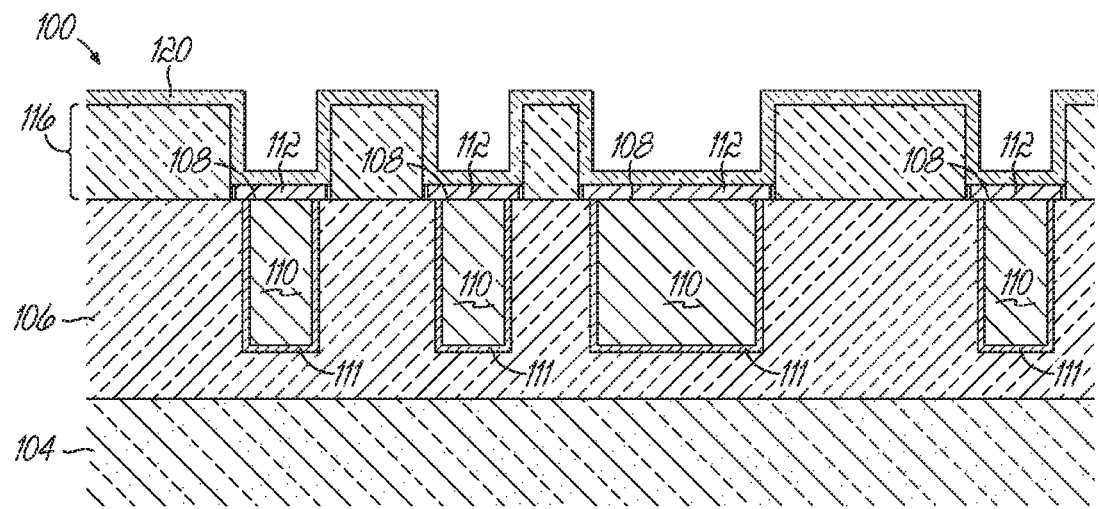

Thereafter, and again without leaving the controlled environment, e.g., without breaking vacuum, in operation 212, with reference to FIGS. 1F, 2, and 3, an etch stop layer 120 is deposited over the recessed pattern 118 features using one or more of the film-forming modules 320. The etch stop layer 120 may include nitrided films with metals, for example tantalum nitride, or dielectric materials, for example silicon nitrides. The deposition of the etch stop layer 120 may be performed in the same film-forming module as in operation 204, operation 206, operation 208, or any combination thereof.

Then, without leaving the controlled environment, e.g., without breaking vacuum, transfer modules 310*a* and 310*b* may be used to transfer the workpiece 100 to the same or a different film-forming module 320 such as first film-forming module 320*a* also hosted on the first common manufacturing platform 300, e.g., transfer module 310*a* removes the workpiece 100 from first film-forming module 320*a* and transfers it to transfer module 310*b*, which then may deliver the workpiece 100 into the first film-forming module 320*a* or to second film-forming module 320*b*. Adjustments to the controlled environment may be made in transfer modules 310*a* and 310*b* if, for example, the second film-forming module 320*b* operates with different parameters than, for example, the first film module 320*a*, such as different vacuum pressures.

Figure 1G:
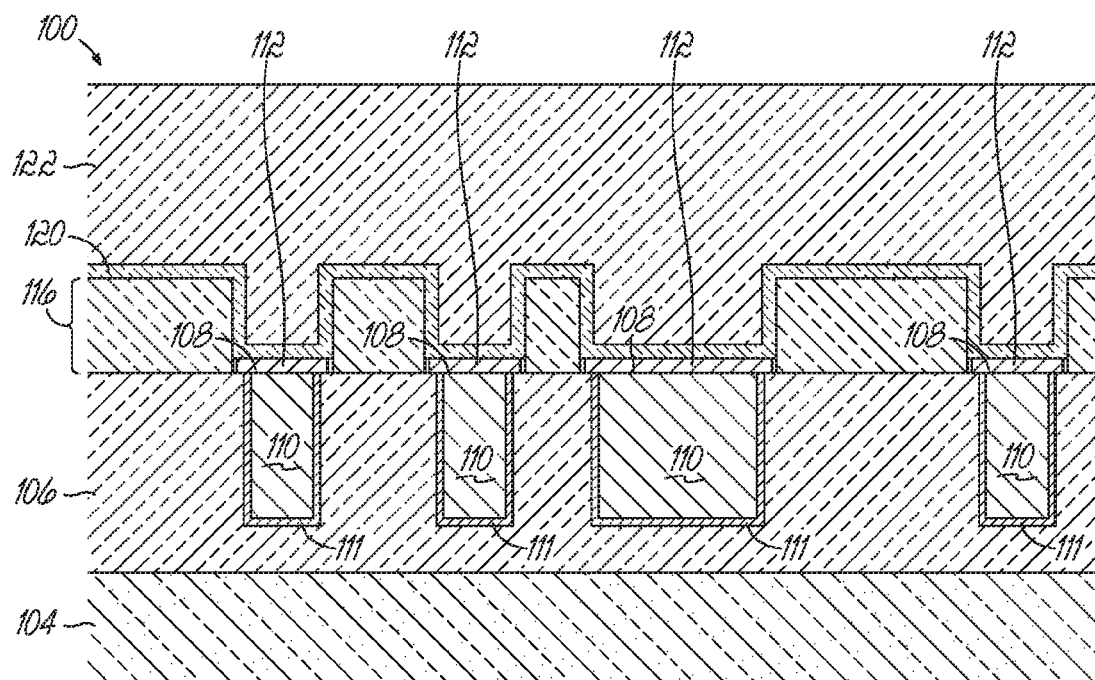

Thereafter, and again without leaving the controlled environment, e.g., without breaking vacuum, in operation 214, with reference to FIGS. 1G, 2, and 3, a second dielectric layer of dielectric material is deposited over the etch stop layer 120 using one or more of the film-forming modules 320, forming an interlayer dielectric film 122. The interlayer dielectric film 122 may include the same material as the first dielectric layer 116, the underlying layer 106, or any combination thereof. For example, the interlayer dielectric film 122 may include an oxide of silicon. The deposition of the interlayer dielectric film 122 may be performed in the same film-forming module as in operation 204, operation 206, operation 208, operation 212, or any combination thereof.

Figure 1H:
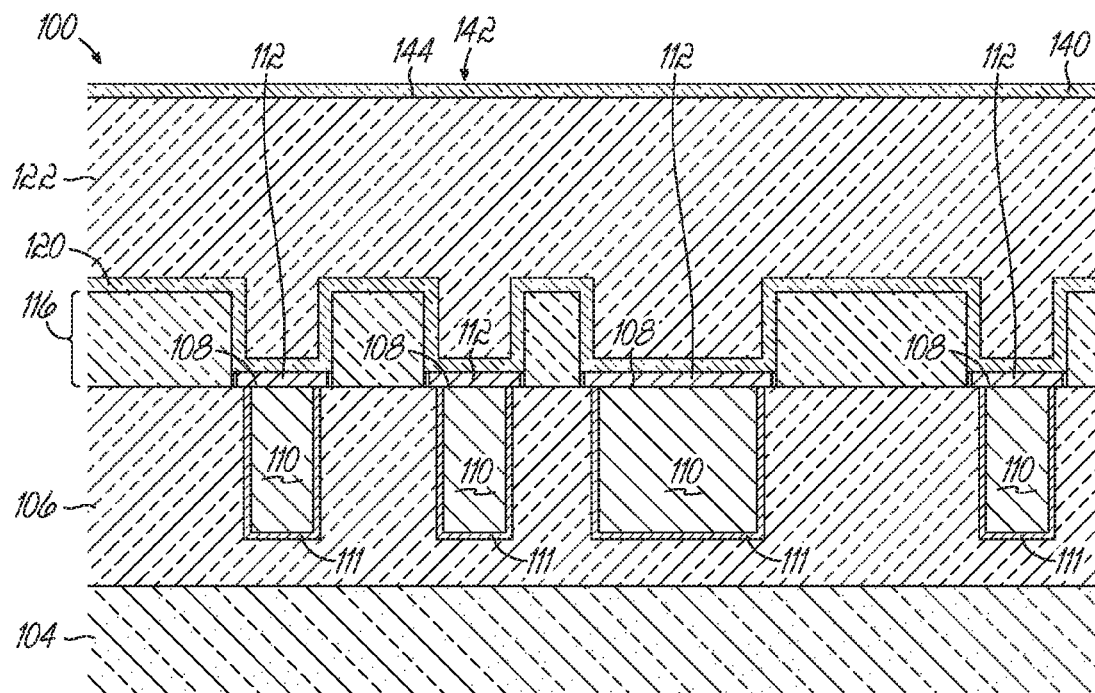

Then, in operation 216, with reference to FIGS. 1H, 2, and 3, the workpiece 100 is transferred to the ancillary module 350 for further processing. The ancillary module 350 does not operate in the controlled environment. The ancillary module 350 may include a track module 354 and a lithography module 352. The workpiece 100 is transferred from the first common manufacturing platform 300 to the ancillary module 350, leaving the controlled environment and breaking the vacuum of the first common manufacturing platform 300. In some examples, the workpiece 100 is transferred to the track module 354. A photo resist layer 140 is spun onto the upper surface of the workpiece 100, specifically the upper surface of the interlayer dielectric 122, in the track module 354. The photo resist layer 140 is a light sensitive layer and is spun onto the upper surface of the workpiece 100 such that the photo resist layer 140 is uniform and covers the upper surface of the workpiece 100, as shown in FIG. 1H.

Then, in operation 218, with further reference to FIGS. 1H, 2, and 3, the workpiece 100 is transferred to the lithography module 352. In some examples, such as the ancillary module 350 shown in FIG. 3, the lithography module 352 may share a common module, such as the ancillary module 350, with the track module 354. Alternatively, the lithography module 352 may be a completely or partially separate module from the track module 354. In the lithography module 352, a mask (not shown) covers portions of the photo resist layer 140 such that portions not covered by the mask are exposed. For example, as shown in FIG. 1H, the exposed portion 142 may be left exposed by the mask. The exposed portion 142 of the photo resist layer 140 is subjected to light in the lithography module 352. The light weakens the photo resist layer 140 that the light contacts, namely the exposed portion 142 of the photo resist layer 140. The mask covers the remainder of the photo resist layer 140 and prevents portions other than the exposed portion 142 from being exposed to light in the lithography module 352. Thus, only the exposed portion 142 of the photo resist layer 140 is weakened by exposure to the light in the lithography module 352.

Figure 1I:
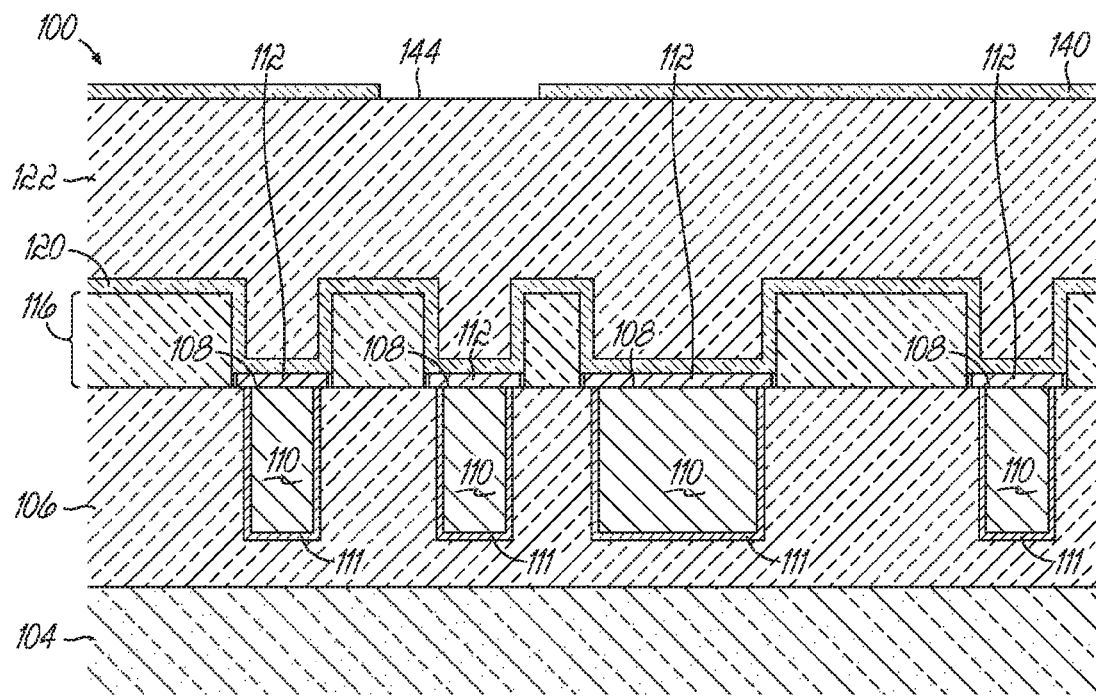

Then, in operation 226, with reference to FIGS. 1I, 2, and 3, the workpiece 100 is developed in a baking process. The baking process removes the exposed portion 142 from the workpiece 100. As shown in FIG. 1I, the baking process results in the removal of the exposed portion 142 (not shown in FIG. 1I because it was removed in the bake) and exposes a portion 144 of the upper surface of the interlayer dielectric 122.

Then, the workpiece 100 is transferred back to a controlled environment. This controlled environment may be present on a common manufacturing platform. This common manufacturing platform may be the same or different common manufacturing platform in which operations 202-214 were performed, that is the first common manufacturing platform 300. Alternatively, the workpiece 100 may be transferred to the second common manufacturing platform 360, which occurs here.

As shown in FIG. 3, the second common manufacturing platform 360 includes a front end module (FEM) 362 and/or a transfer module 370*a* that may be used to bring the workpiece 100 into the controlled environment of the second common manufacturing platform 360, which controlled environment is maintained throughout at least a portion of the process flow 200. The controlled environment may include a vacuum environment, where at least some operations in the process flow 200 is conducted without breaking vacuum, or an inert gas atmosphere, or a combination thereof. A single transfer module, such as transfer module 370*a*, may be coupled between each processing module or tool, or separate transfer modules may be used for each tool transfer. Where different processing modules on the second common manufacturing platform 360 require different controlled environments, such as different vacuum pressures or vacuum in one module followed by a module with inert gas atmosphere, multiple transfer modules may be used where the transfer modules assist in implementing the transitions between the different controlled environments. While a single transfer module may be useful in a cluster-type tool where same-type processing modules are positioned in a circle around the transfer module, multiple transfer modules may be more appropriate in an end-to-end platform configuration with different processing module types.

A front-end module 362 may be used to load a cassette of workpieces (not shown), sequentially line up the workpieces and insert them into a load lock, then into transfer module 370a in a controlled environment, and the transfer module 370a sequentially loads the workpieces into a processing module. In the second common manufacturing platform 360 and with respect to operation 222, the workpiece 100, which has been received into the controlled environment, is loaded by the transfer module 370a into an etching module 390, such as first etching module 390b, hosted on the second common manufacturing platform 360 without leaving the controlled environment, e.g., without breaking vacuum. Etching modules 390a, 390b located on the second common manufacturing platform 360 may be collectively referred to herein as etching modules 390 where appropriate. Similarly, deposition modules 380a, 380b may be collectively referred to herein as deposition modules 380 where appropriate. Adjustments to the controlled environment may be made in transfer module 370a if etching module 390 operates with different parameters than the front end module 362, such as different vacuum pressures.

Figure 1J:
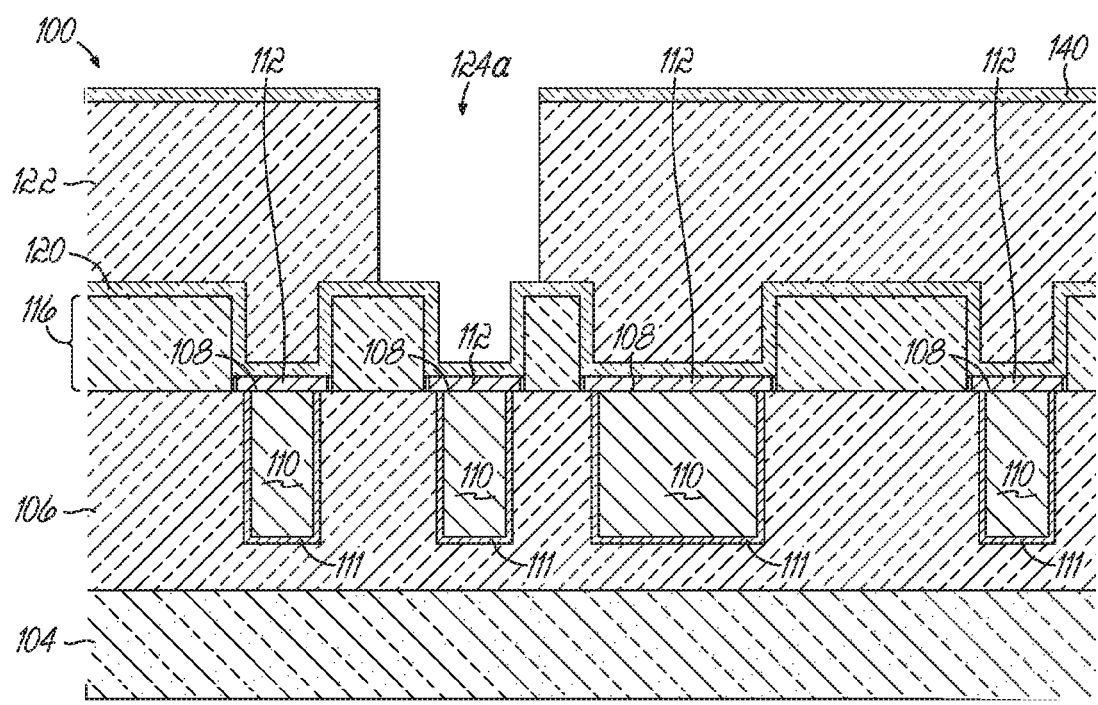

Thereafter, and without leaving the controlled environment, e.g., without breaking vacuum, in operation 222, with reference to FIGS. 1J, 2, and 3, the exposed portion 144 of the interlayer dielectric film 122 is etched to form one or more via features 124a. The via features 124a are formed by etching the interlayer dielectric film 122 to the etch stop layer 120 using one of the one or more etching modules 330. As a result, the etch stop layer 120 is exposed at the bottom of the one or more via features 124a, as shown in FIG. 1J. Exposure of the etch stop layer 120 may serve as an indication for the etching module 330 to stop etching deeper into the workpiece 100 toward the substrate 104.

Then, without leaving the controlled environment, e.g., without breaking vacuum, transfer module 370a may be used to transfer the workpiece 100 to the etching module 390, such as second etching module 390b, also hosted on the second common manufacturing platform 360, e.g., transfer module 370a removes the workpiece 100 from etching module 390a and delivers the workpiece 100 into the second etching module 330b. Adjustments to the controlled environment may be made in transfer modules 370a if etching module 390b operates with different parameters than etching module 390a, such as different vacuum pressures.

Figure 1K:
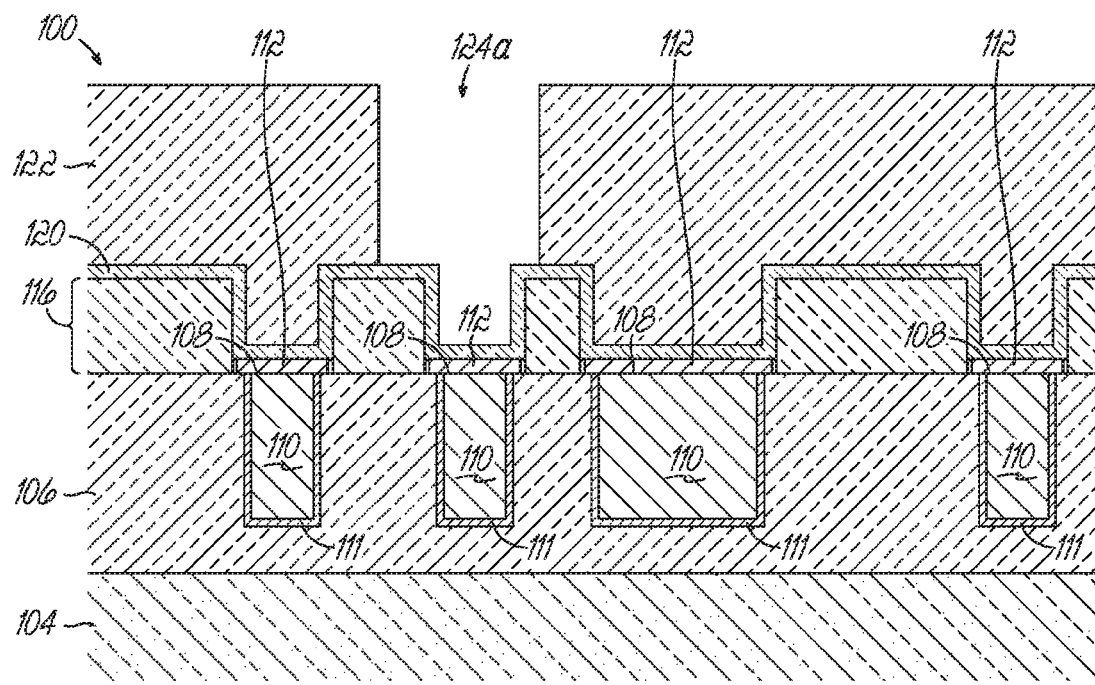

Thereafter, and again without leaving the controlled environment, e.g., without breaking vacuum, with reference to FIGS. 1K, and 3, the photo resist layer 140 is etched from the upper surface of the interlayer dielectric 122, such as within second etching module 390b. As a result, the upper surface of the interlayer dielectric 122 is exposed and prepared for deposition of metal feature material.

Figure 1L:
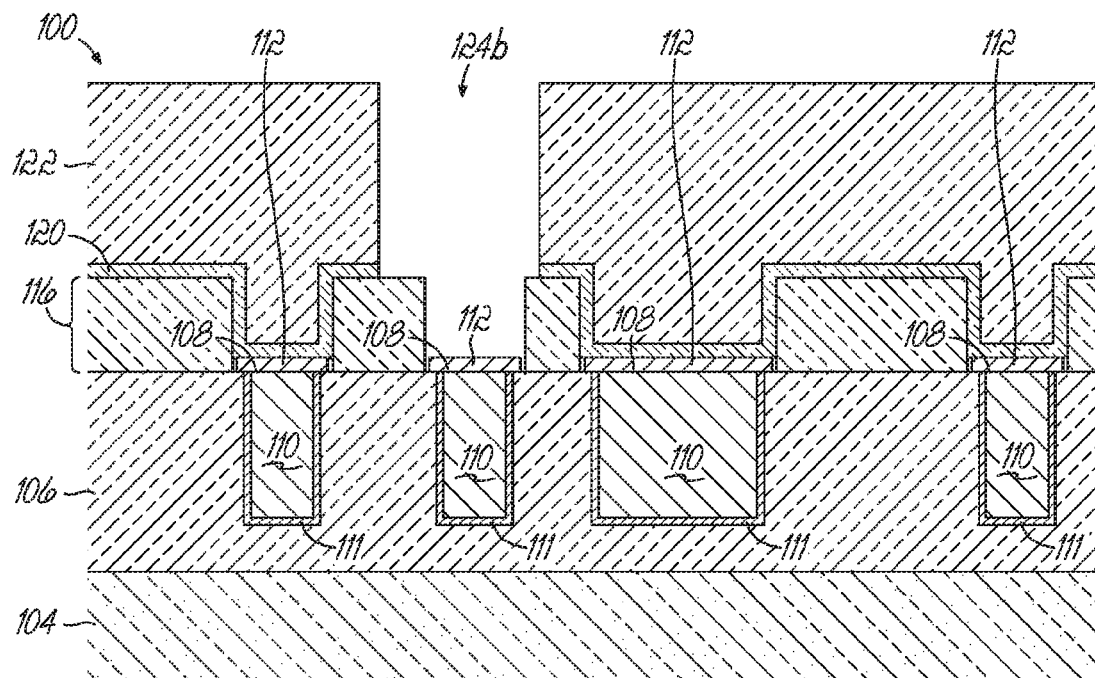

Thereafter, and again without leaving the controlled environment, e.g., without breaking vacuum, in operation 224, with reference to FIGS. 1L, 2, and 3, the exposed etch stop layer 120 is etched to further form one or more via features 124b. The via features 124b are formed by etching the exposed etch stop layer 120 using one of the one or more etching modules 390. As a result, at least some of the metal caps 112 are exposed at the bottom of the one or more via features 124b, as shown in FIG. 1L. Exposure of the metal caps 112 may serve as an indication for the etching module 390 to stop etching deeper into the workpiece 100 toward the substrate 104.

Then, without leaving the controlled environment, e.g., without breaking vacuum, transfer module 370a may be used to transfer the workpiece 100 to the film-forming module 380 such as film-forming module 380a or 380b also hosted on the second common manufacturing platform 360, e.g., transfer module 370a removes the workpiece 100 from etching module 390 and delivers the workpiece 100 into the film-forming module 380a or 380b. Adjustments to the controlled environment may be made in transfer module 370a if the film-forming module 380 operates with different parameters than etching module 390, such as different vacuum pressures.

Figure 1M:
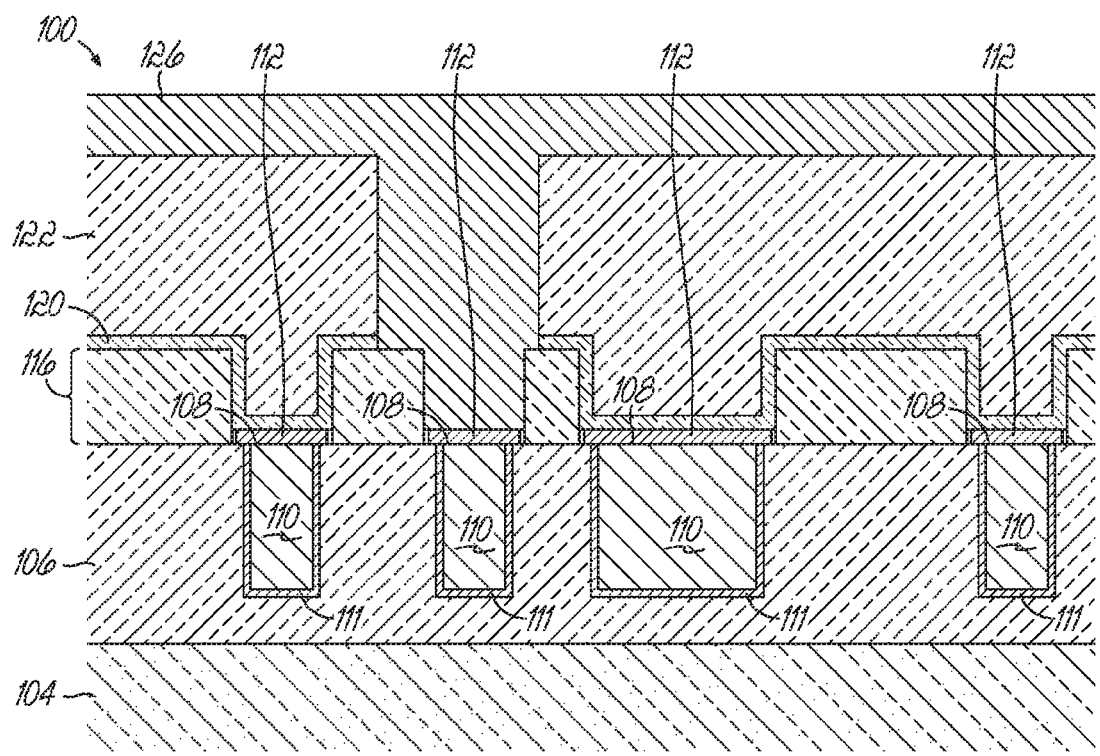

Thereafter, and again without leaving the controlled environment, e.g., without breaking vacuum, in operation 226, with reference to FIGS. 1M, 2, and 3, a metal 126 is deposited into the via features 124b using the film-forming module 320. The via feature 124b is filled with the metal 126 over the metal caps 112 in the film-forming module 320. In some examples, the metal 126 is selected from the group consisting of ruthenium, tungsten, cobalt, copper, and combinations thereof.

Optionally, the workpiece may be subjected to one or more cleaning processes before further patterning operations. For example, cleaning may be performed in the same cleaning module 340a, 340b hosted on the first common manufacturing platform 300. A transfer module 310 may be used to transfer the workpiece from the film-forming module 380 to, for example, the first common manufacturing platform 300, and then to the cleaning module 340. As shown, transfer modules 310a, 310b, 370a may be used to make the transfer, the transfer module 370a removing the workpiece from, for example, the film-forming module 380a, and eventually transferring it to the transfer module 310b, which then delivers the workpiece into the cleaning module 340. Again, the first common manufacturing platform 300 may include two identical cleaning modules 340 on the same or opposing sides of the transfer module 310b. It should be understood that second common manufacturing platform 360 and/or ancillary module 350 also may include one or more cleaning module so that cleaning may be performed therein.

In one embodiment, and as will be discussed in more detail below, the first and/or second common manufacturing platform 300, 360 advantageously includes an "active interdiction system." As shown and discussed here with respect to the first common manufacturing platform 300, the active interdiction system includes a workpiece measurement region within a transfer module 310 hosted on the first common manufacturing platform 300 or an integrated metrology module (not shown) hosted on the first common manufacturing platform 300. The workpiece measurement region may be located in a dedicated area of the transfer module 310, as described in more detail below. The workpiece measurement region or metrology module may include an inspection system for gathering measurement data. As described in more detail below, the inspection system may include at least one optical source for directing an optical beam incident on a measurement surface of the workpiece and at least one detector arranged to receive an optical signal scattered from the measurement surface of the workpiece. The active interdiction system may further include an intelligence system hosted on the first common manufacturing platform 300 that is configured to gather data from the workpiece measurement region or metrology module and control the integrated sequence of processing steps executed on the first common manufacturing platform 300, such as process flow 200.

For active interdiction in accordance with embodiments of the invention, the workpiece measurement region or metrology module collects real time data "on the fly" pertaining to attributes of features or layers on the semiconductor workpiece (e.g., film or feature thickness, feature depth, surface roughness, pattern shift, voids or other defects, loss of selectivity, lateral overgrowth, uniformity, etc.) and uses such real time data to concurrently control integration operating variables in the integrated processing modules hosted on the first common manufacturing platform 300. The data can be used in a feed-back and/or feed-forward manner to control operations performed on the workpiece in subsequent modules and/or to control operations performed in prior modules on a subsequent workpiece, for example as will be explained below with reference to operations 250-272 of FIG. 2. In an embodiment, the first common manufacturing platform 300 includes a correction module, which may be a film-forming module 320, an etching module 330, or other type of treatment module as appropriate for applying corrective action or remedial treatment to the workpiece 100.

Unlike traditional metrology or process control, the workpiece does not leave the controlled environment of the first common manufacturing platform 300 (for certain process steps) to enter a stand-alone metrology tool thereby minimizing oxidation and defect generation, the measurements are non-destructive such that no workpiece is sacrificed to obtain data thereby maximizing production output, and the data can be collected in real time as part of the process flow to avoid negatively impacting production time and to enable in-process adjustments to the workpiece or to subsequent workpieces being sequentially processed on the first common manufacturing platform 300. Additionally, the measurements are not performed in the film-forming or etching modules, thereby avoiding issues when measurement devices are exposed to process fluids. For example, by incorporating workpiece measurement regions into the transfer module, the data can be obtained as the workpiece is traveling between processing tools with little to no delay in the process flow, without exposure to process fluids, and without leaving the controlled environment, e.g., without breaking vacuum. While the "on the fly" data may not be as accurate as the data obtained from traditional destructive methods performed in stand-alone metrology tools, the nearly instantaneous feedback on the process flow and ability to make real-time adjustment without interrupting the process flow or sacrificing yield is highly beneficial for high-volume manufacturing.

With further reference to the process flow 200 of FIG. 2, the method may include inspecting the workpiece, such as performing metrology, i.e., obtaining measurement data, using the active interdiction system at any of various times throughout the integrated method, without leaving the controlled environment of the first common manufacturing platform 300, e.g., without breaking vacuum. Inspection of the workpiece may include characterizing one or more attributes of the workpiece and determining whether the attribute meets a target condition. For example, the inspection may include obtaining measurement data related to an attribute and determining whether a defectivity, a film conformality, a thickness, a uniformity, and/or a selectivity condition meets a target for that condition. While the following discussion will focus on obtaining measurement data, it may be understood that other inspection techniques performed within the controlled environment of the common manufacturing platform are also within the scope of the invention.

The active interdiction system may include a single metrology module or workpiece measurement region on the first common manufacturing platform 300 or may include multiple metrology modules 312c, 312d or workpiece measurement regions 312a, 312b on the first common manufacturing platform 300, as will be discussed in more detail below. Each metrology operation is optional, as indicated by the phantom lines in FIG. 2, but may be advantageously performed at one or more points in the process flow to ensure the workpiece 100 is within specification to reduce defectivity and EPE. In one embodiment, measurement data is obtained after each step of the integrated sequence of processing steps conducted on the common manufacturing platform. The measurement data may be used to repair the workpiece in a correction module prior to leaving the common manufacturing platform, and/or may be used to alter parameters of the integrated sequence of processing steps for subsequent workpieces. It should be understood that the ancillary module 350 and/or second common manufacturing platform 360 can include a metrology module(s), e.g., metrology module 372a, and advantageously include an "active interdiction system", as discussed above and further explained below with respect to the first common manufacturing platform 300.

In broad terms, within the controlled environment of the first common manufacturing platform 300 and/or the second common manufacturing platform 360 (and optionally the ancillary module 350), measurement data may be obtained during the integrated sequence of processing steps related to the formation of the fully self-aligned via and, based on the measurement data, a determination may be made whether a thickness, width, or profile of any applied layer or metal cap meets a target condition. The applied layer or metal cap may include the underlying layer 106, the first dielectric layer 116, the second dielectric layer 122, the etch stop layer 120, the barrier layer 114, the metal feature 110, metal cap 112, photo resist layer 140, or combinations thereof. When the thickness, width, or profile of any applied layer or metal cap is determined to not meet the target condition, the workpiece 100 may be processed in a correction module on the common manufacturing platform to alter the sidewall spacer pattern. In one embodiment, when the target thickness, width, or profile of the sidewall spacer pattern is not met, the sidewall spacer pattern may be repaired by (i) obtaining measurement data related to the metal caps and/or of the exposed surfaces of the underlying layer 106, first dielectric layer 116, or second dielectric layer 122 for use in a first verification process to verify that the metal caps completely cover the exposed surfaces 108 of the metal features 110 and/or to verify an absence of metal nuclei on the exposed surfaces 108 of the underlying layer 106 as a contaminant; (ii) obtaining measurement data related to attributes of the metal caps 112 for use in a second verification process to verify that the barrier layer 114 is removed; (iii) obtaining measurement data related to attributes of the first dielectric layer 116 material selectively deposited on the exposed surfaces of the underlying layer 106 for use in a third verification process to verify that the first dielectric layer 116 material completely covers the exposed surfaces of the underlying layer 106 and/or to verify an absence of the first dielectric layer 116 material on the exposed surfaces 108 of the metal caps 112, and (iv) obtaining measurement data related to attributes of the metal caps 112 exposed at the bottom of the one or more via features 124a, 124b for use in a fourth verification process to verify that the exposed etch stop layer 120 is removed.

In an embodiment, when a conformality or uniformity of an underlying layer 106, dielectric layer 116, interlayer dielectric film 122, metal cap 112, barrier layer 114, or etch stop layer 120 applied in a film-forming module 320 on the first common manufacturing platform 300 does not meet a target conformality or target uniformity for the layer or metal cap, corrective action may be taken to repair the layer or metal cap. Repairing a selective layer or metal cap may be accomplished by removing the applied layer or metal cap and reapplying the layer or metal cap, selectively applying an additional layer or metal cap, etching the applied layer or metal cap, or a combination of two or more thereof. For example, the workpiece 100 may be transferred to a correction etching module 330 to remove the layer or metal cap or partially etch the layer or metal cap, and/or the workpiece 100 may be transferred to a correction film-forming module 320 to reapply the layer or metal cap after it is removed or to apply additional dielectric or metal material over the existing layer or metal cap or partially etched layer or metal cap.

The process flow 200 of FIG. 2 will now be described in detail with the optional metrology operations. Operation 202 includes receiving the workpiece into the first common manufacturing platform 300, the workpiece having a pattern of metal features in a dielectric layer wherein exposed surfaces of the metal features and exposed surfaces of the dielectric layer together define an upper planar surface. Operation 250 includes optionally performing metrology to obtain measurement data related to attributes of the incoming workpiece, such as attributes of the metal features, layout of the metal feature pattern, and underlying layer within which metal features are formed, which measurement data may be used to adjust and/or control process parameters of any one of operations 202-226. Additionally, one or more of the operations 202-226 may be performed without performed entirely, or in part, on the common manufacturing platforms 330, such that the end-to-end sequencing described in operations 202-226 may be performed, in part, on a plurality of processing tools.

Operation 204 includes selectively depositing metal caps on the exposed surfaces of the metal features relative to the exposed dielectric material using one of the one or more of the film-forming modules. Operation 252 includes optionally performing metrology to obtain measurement data related to attributes of the workpiece having the selective metal caps applied, such as attributes of the selective metal caps, the metal features as affected by the metal cap deposition, and/or the underlying layer into which the metal features are formed as affected by the metal cap deposition, which measurement data may be used to adjust and/or control process parameters of any one of operations 206-226, may be used to make adjustments for subsequent workpieces to the incoming attributes of the workpieces in operation 202 or to operation 204, or may be used to repair the workpiece before continued processing. In one embodiment, when the measurement data indicates that one or more attributes do not meet a target condition, the workpiece may be transferred to a correction module to repair the selectively applied metal caps. For example, when a selectivity or uniformity of the metal caps do not meet a target selectivity or target uniformity, corrective action may be taken in one or more correction modules, such as removing the metal caps and reapplying the metal caps, selectively applying additional metal cap material, etching the metal cap, or a combination of two or more thereof.

Operation 206 includes selectively forming a barrier layer on the metal caps, using one of the one or more film-forming modules, relative to the exposed dielectric material. Operation 254 includes optionally performing metrology to obtain measurement data related to attributes of the workpiece having the barrier layer deposited thereon, such as attributes of the barrier layer, metal caps as affected by the barrier layer, the metal features as affected by the barrier layer, and/or the underlying layer as affected by the barrier layer, which measurement data may be used to adjust and/or control process parameters of any one of operations 208-226, may be used to make adjustments for subsequent workpieces to the incoming attributes of the workpieces in operation 202 or to operations 204-206, or may be used to repair the workpiece before continued processing. In one embodiment, when the measurement data indicates that one or more attributes do not meet a target condition, the workpiece may be transferred to a correction module to repair the barrier layer. For example, when the thickness, width, or profile of the barrier layer does not meet a target thickness, width, or profile of the metal caps, corrective action may be taken in one or more correction modules, such as by selectively depositing additional barrier layer material onto the metal caps, reshaping the barrier layer, etching the barrier layer, or a combination of two or more thereof. In some examples, the remedial action to ameliorate the non-conformity when the measurement data indicates the non-conformity is present on the workpiece includes removing the self-assembled monolayer when the pre-determined monolayer coverage threshold is exceeded and/or removing metal nuclei from the dielectric layer when the predetermined metal nuclei threshold is exceeded.

Operation 208 includes selectively depositing a first dielectric material on the exposed surfaces of the dielectric layer using one of the one or more film-forming modules to form a recess pattern in the first dielectric material, the selective deposition being based, at least in part, on a deposition rate of the first dielectric material being higher on the exposed surfaces than on the metal caps, the recess pattern comprising a sidewall including a portion of the first dielectric material. Operation 256 includes optionally performing metrology to obtain measurement data related to attributes of the workpiece having the recess pattern in the first dielectric layer, such as attributes of the sidewalls, the depth of the recessed feature in the first dielectric layer, the exposure of the barrier layer, and the coverage of the underlying dielectric layer on the workpiece as affected by the deposition of the first dielectric layer and/or the underlying layer as affected by the deposition of the first dielectric layer, which measurement data may be used to adjust and/or control process parameters of any one of operations 210-226, may be used to make adjustments for subsequent workpieces to the incoming attributes of the workpieces in operation 202 or to operations 204-208, or may be used to repair the workpiece before continued processing. In one embodiment, when the measurement data indicates that one or more attributes do not meet a target condition, the workpiece may be transferred to a correction module to repair the first dielectric layer. For example, when the thickness, width, or profile of the first dielectric layer does not meet a target thickness, width, or profile of the first dielectric layer, corrective action may be taken in one or more correction modules, such as by selectively depositing additional material onto the underlying layer, etching the first dielectric layer, or a combination of two or more thereof. The remedial action may include removing the self-assembled monolayer from the metals caps based, at least in part, on the measurement data related to attributes of the metal caps and/or removing the first dielectric layer from the exposed surfaces of the metal caps based, at least in part, on measurement data related to attributes of the first dielectric material.

Operation 210 includes treating the workpiece to expose the metal caps at the bottom surfaces of the recess pattern. Operation 258 includes optionally performing metrology to obtain measurement data related to attributes of the workpiece treated to have the metal caps exposed at the bottom surface of the recess pattern, such as attributes of the metal caps, the barrier layer as affected by the treatment, and/or the underlying layer as affected by the treatment, which measurement data may be used to adjust and/or control process parameters of any one of operations 212-226, may be used to make adjustments for subsequent workpieces to the incoming attributes of the workpieces in operation 202 or to operations 204-208, or may be used to repair the workpiece before continued processing. In one embodiment, when the measurement data indicates that one or more attributes do not meet a target condition, the workpiece may be transferred to a correction module to repair the treatment of the workpiece to expose the metal caps at the bottom surfaces of the recess pattern. For example, when a conformality or uniformity of the recess pattern does not meet a target conformality or target uniformity for the recess pattern, corrective action may be taken in one or more correction modules, such as further treatment of the recess pattern to further remove the barrier layer.

Operation 212 depositing an etch stop layer over the recess pattern using one of the one or more film-forming modules. Operation 260 includes optionally performing metrology to obtain measurement data related to attributes of the workpiece having the etch stop layer formed thereon, such as attributes of the workpiece having the etch stop layer formed thereon, the recess pattern as affected by the etch stop layer, and/or the underlying layer as affected by the etch stop layer, which measurement data may be used to adjust and/or control process parameters of any one of operations 214-226, may be used to make adjustments for subsequent workpieces to the incoming attributes of the workpieces in operation 202 or to operations 204-210, or may be used to repair the workpiece before continued processing. In one embodiment, when the measurement data indicates that one or more attributes do not meet a target condition, the workpiece may be transferred to a correction module to repair the etch stop layer over the recess pattern. For example, when the thickness, width, or profile of the etch stop layer does not meet a target thickness, width, or profile of the etch stop layer, corrective action may be taken in one or more correction modules, such as by selectively depositing additional material onto the recess pattern, reshaping the etch stop layer, etching a portion of the etch stop layer, or a combination of two or more thereof.

Operation 214 includes depositing a second dielectric material on the etch stop layer to form an interlayer dielectric film over and/or in the recess pattern using one of the one or more film-forming modules Operation 262 includes optionally performing metrology to obtain measurement data related to attributes of the workpiece having the second dielectric material, such as attributes of the etch stop layer as affected by the second dielectric material and/or the underlying layer as affected by the second dielectric material, which measurement data may be used to adjust and/or control process parameters of operation 214, may be used to make adjustments for subsequent workpieces to the incoming attributes of the workpieces in operation 202 or to operations 204-226, or may be used to repair the workpiece before continued processing. In one embodiment, when the measurement data indicates that one or more attributes do not meet a target condition, the workpiece may be transferred to a correction module to repair the interlayer dielectric film. For example, when the thickness, width, or profile of the interlayer dielectric film does not meet a target thickness, width, or profile of the interlayer dielectric film, corrective action may be taken in one or more correction modules, such as by selectively depositing additional second dielectric material onto the etch stop layer, etching the second dielectric material, or a combination of two or more thereof.

Hereinafter, measurement data may continue to be obtained during the sequence of processing steps related to the formation of the fully self-aligned via. But here, if measurement data is going to be obtained utilizing the first common manufacturing platform 300, workpieces will need to be transferred between platforms 300, 360 and/or ancillary module 350. In certain embodiments, it is contemplated that the second common manufacturing platform 360 and/or ancillary module 350 can include their own metrology module(s), e.g., metrology module 372a, and advantageously include their own "active interdiction system". In that instance, measurement data may continue to be obtained within a controlled environment at least with respect to the second common manufacturing platform 360 and as associated with its own corresponding sequence of processing steps, for example.

Operation 216 includes depositing a photo resist layer on the interlayer dielectric film. Operation 264 includes optionally performing metrology to obtain measurement data related to attributes of the workpiece having the photo resist layer deposited thereon, such as attributes of the etch stop layer as affected by the photo resist layer and/or the underlying layer as affected by the photo resist layer, which measurement data may be used to adjust and/or control process parameters of operations 226, may be used to make adjustments for subsequent workpieces to the incoming attributes of the workpieces in operation 202 or to operations 204-226, or may be used to repair the workpiece before continued processing. In one embodiment, when the measurement data indicates that one or more attributes do not meet a target condition, the workpiece may be transferred to a correction module to repair the photo resist layer. For example, when the thickness, width, uniformity, or profile of the photo resist layer does not meet a target thickness, width, uniformity, or profile of the interlayer dielectric film, corrective action may be taken in one or more correction modules, such as by selectively depositing additional photo resist layer material onto the workpiece, etching the photo resist layer, or a combination of two or more thereof.

Operation 218 includes exposing a photo resist layer to light at least to weaken the photo resist layer. Operation 266 includes optionally performing metrology to obtain measurement data related to attributes of the workpiece having the photo resist layer deposited thereon, such as attributes of portions of the photo resist layer as affected by the light exposure. This measurement data may be used to adjust and/or control process parameters of operations 226, may be used to make adjustments for subsequent workpieces to the incoming attributes of the workpieces in operation 202 or to operations 204-226, or may be used to repair the workpiece before continued processing. In one embodiment, when the measurement data indicates that one or more attributes do not meet a target condition, the workpiece may be transferred to a correction module to repair the photo resist layer. For example, when the specific portions or desired weakness of the photo resist layer does not meet a target specific portions or desired weakness of the photo resist layer, corrective action may be taken in one or more correction modules, such as by selectively depositing additional photo resist layer material onto the workpiece, etching the photo resist layer, further exposing portions of the photo resist layer to light, or a combination of two or more thereof.

Operation 226 includes baking or developing a portion of the photo resist layer on the interlayer dielectric film. Operation 268 includes optionally performing metrology to obtain measurement data related to attributes of the workpiece having the photo resist layer deposited thereon, such as attributes of the photo resist layer and/or attributes of the interlayer dielectric film as affected by the photo resist layer, which measurement data may be used to adjust and/or control process parameters of operations 226, may be used to make adjustments for subsequent workpieces to the incoming attributes of the workpieces in operation 202 or to operations 204-226, or may be used to repair the workpiece before continued processing. In one embodiment, when the measurement data indicates that one or more attributes do not meet a target condition, the workpiece may be transferred to a correction module to repair the photo resist layer. For example, when the portions of the photo resist layer removed in the baking/development process do not meet a target portion removed, corrective action may be taken in one or more correction modules, such as by selectively depositing additional photo resist layer material onto the workpiece, etching the photo resist layer, further exposing portions of the photo resist layer to light, or a combination of two or more thereof.

Operation 222 includes etching one or more via features through the interlayer dielectric to the etch stop layer using one of the one or more etching modules, the etch stop layer exposed at a bottom of the one or more via features. Operation 270 includes optionally performing metrology to obtain measurement data related to attributes of the workpiece having the etched via features though the interlayer dielectric film, such as attributes of the etch stop layer as affected by the second dielectric material and/or the underlying layer as affected by the second dielectric material, which measurement data may be used to adjust and/or control process parameters of operation 222, may be used to make adjustments for subsequent workpieces to the incoming attributes of the workpieces in operation 202 or to operations 204-226, or may be used to repair the workpiece before continued processing. In one embodiment, when the measurement data indicates that one or more attributes do not meet a target condition, the workpiece may be transferred to a correction module to repair the interlayer dielectric film. For example, when the thickness, width, or profile of the interlayer dielectric film does not meet a target thickness, width, or profile of the interlayer dielectric film, corrective action may be taken in one or more correction modules, such as by selectively depositing additional second dielectric material onto the etch stop layer, etching the second dielectric material, or a combination of two or more thereof.

Operation 224 includes etching the exposed etch stop layer at the bottom of the one or more via features using one of the one or more etching modules to expose the metal caps at the bottom of the one or more via features. Operation 272 includes optionally performing metrology to obtain measurement data related to attributes of the workpiece having the etched via features though the etch stop layer, such as attributes of the etch stop layer as affected by the exposure of the metal cap and/or the underlying layer as affected by the exposure of the metal cap, which measurement data may be used to adjust and/or control process parameters of operation 224, may be used to make adjustments for subsequent workpieces to the incoming attributes of the workpieces in operation 202 or to operations 204-226, or may be used to repair the workpiece before continued processing. In one embodiment, when the measurement data indicates that one or more attributes do not meet a target condition, the workpiece may be transferred to a correction module to repair the via feature through the etch stop layer. For example, when the thickness, width, or profile of the via feature through the etch stop layer does not meet a target depth, width, or profile of the via feature, corrective action may be taken in one or more correction modules, such as by etching the etch stop layer.

Operation 226 includes filling the one or more via features over the metal caps with a metal using one of the one or more film-forming modules. Operation 226 may further include optionally performing metrology to obtain measurement data related to attributes of the workpiece having via feature filled over the metal caps, such as attributes of the via feature as affected by filling the one or more via features over the metal caps and/or the underlying layer as affected by filling the one or more via features over the metal caps, which measurement data may be used to adjust and/or control process parameters of operation 226, may be used to make adjustments for subsequent workpieces to the incoming attributes of the workpieces in operation 202 or to operations 204-226, or may be used to repair the workpiece before continued processing. In one embodiment, when the measurement data indicates that one or more attributes do not meet a target condition, the workpiece may be transferred to a correction module to repair the filling of the via feature. For example, when the thickness, width, or profile of the filled via feature does not meet a target depth, width, or profile of the via feature, corrective action may be taken in one or more correction modules, such as by depositing additional metal into the via feature, etching an overburdened filled via feature, or a combination of two or more thereof.

Process parameters, as referred to above, may include any operating variable within a processing module, such as but not limited to: gas flow rates; compositions of etchants, deposition reactants, purge gases, etc.; chamber pressure; temperature; electrode spacing; power; etc. The intelligence system of the active interdiction system is configured to gather measurement data from the inspection system and control the integrated sequence of processing steps executed on the common manufacturing platform, for example, by making in situ adjustments to processing parameters in subsequent processing modules for the workpiece in process, or by changing process parameters in one or more processing modules for subsequent workpieces. Thus, the obtained measurement data may be used to identify a needed repair to the workpiece during the integrated sequence of processing steps to avoid having to scrap the workpiece, and/or to adjust processing parameters for the integrated sequence of processing steps for steps performed on the same workpiece after the measurement data is obtained or for processing subsequent workpieces to reduce occurrences of the target conditions not being met for the subsequent workpieces.

Referring now to FIGS. 4A-4B, a comparison of traditional via to FSAV fabrication is shown. For example, workpiece 100 is the same workpiece as was described above and shown in FIG. 1M. As shown in FIG. 4A, workpiece 100 is an example of a workpiece 100 having a fully self-aligned via including the substrate 104, underlying layer 106, metal features 110, metal caps 112, first dielectric layer 116, etch stop layer 120, second dielectric layer 122, and filled feature with metal 126. Referring to FIG. 4B, workpiece 100' is an example of a traditionally fabricated filled recessed feature on a workpiece 100' including an underlying layer 106', a metal cap 112', a metal feature 110', and a filled feature with metal 126'. A via distance V from the corner of the metal cap 112 to the corner of the metal 126 is larger than a via distance V' from the metal cap 112' to the metal 126'. The FSAV arrangement is advantageous over the conventional arrangement at least because under the conventional arrangement, the semiconductor may short, causing damage to the semiconductor or even failure. Semiconductors including fully self-aligned vias short far less than traditional arrangements leading to a more reliable product.

As disclosed herein the term "metrology module" or "measurement module" refers to a module/system/sensor/tool that can make measurements on a workpiece to detect or determine various non-conformities or variations on the workpiece, such as parametric variations, or to detect or determine defects on the workpiece, such as a contamination of some kind. As used herein, the term "inspection system" will generally refer to the tool or system of a measurement process or module that measures and collects data or signals associated with the measurement. The measurement modules will make measurements and provide data for use in the processing platform as disclosed further herein. The terms "metrology module" and "measurement module" will be used interchangeably herein, and generally refer to measurement or metrology or sensing tools used to detect and measure attributes of a workpiece that are indicative of the processing of the workpiece and the layers and devices being formed thereon.

To move workpieces between the various processing modules, the common manufacturing platform, such as the first and/or second common manufacturing platform 300, 360, and ancillary module 350 can generally incorporate one or more workpiece transfer modules that are hosted on the common manufacturing platform and are configured for the movement of the workpiece between the processing modules and the measurement module(s). A measurement module might be coupled with the workpiece transfer module similar to a processing module. In some embodiments of the invention, as disclosed herein, a measurement module or the inspection system associated therewith is incorporated with or inside a transfer module to provide for measurement or metrology as the workpiece is moved between processing modules. For example, a measurement module, or a portion thereof, might be positioned inside an internal space of the transfer module. Herein, the combination transfer and measurement apparatus will be referred to as a transfer measurement module ("TMM").

In one embodiment, the common manufacturing platform including both processing chambers and measurement modules, such as the first and/or second common manufacturing platform 300, 360, and the ancillary module 350 can be actively controlled by a system that processes the measured data associated with an attribute on the workpiece and uses the measured data for controlling movement and processing of the workpiece in a processing sequence. In accordance with embodiments of the invention, the control system uses measured data and other data to perform corrective processing based in part on the measured data to provide active interdiction of the processing sequence to correct non-conformities or defects. More specifically, an active interdiction control system can be hosted on the common manufacturing platforms and ancillary module 350 and configured to perform corrective processing based in part on the measured data, wherein the corrective processing of the workpiece might be performed in the processing modules of the platform that are upstream or downstream in the process sequence to address situations where non-conformities or defects are detected. In an embodiment of the invention, the workpiece is maintained in one or more controlled environments, such as under vacuum, for example. That is, on the common manufacturing platform, the processing modules and the measurement module can operate in a controlled environment, and the workpiece transfer module transfers the workpiece between the plurality of processing modules in the processing sequence and one or more measurement modules without leaving the controlled environment.

As used herein, the term "active interdiction" refers generally to the control system as implemented for capturing measurement/metrology data in real time with respect to various fabrication processes to obtain data on workpiece attributes and thereby detect non-conformities or defects and the corrective aspects of the control to correct or ameliorate the non-conformities or defects. The active interdiction control system uses the data for correction and amelioration of various non-conformities in the semiconductor fabrication process by actively varying the processing sequence and/or the operation of modules that perform process steps. Thus, the active interdiction control system also interfaces with one or more transfer modules (e.g., 310) used to move workpieces through the process. The active interdiction control system (322 in FIG. 3, as further described below) coordinates the data collection and data analysis and detection of non-conformities with the fabrication process and further directs the actions of multiple processing modules so as to address the non-conformities or defects that are detected. The active interdiction control system is implemented generally by one or more computer or computing devices as described herein that operate a specially designed sets of programs such as deep learning programs or autonomous learning components referred to collectively herein as active interdiction components. As may be appreciated, the active interdiction control system may incorporate multiple programs/components to coordinate the data collection from various measurement modules and the subsequent analysis. The active interdiction control system interfaces with the multiple processing modules in the common manufacturing platform in order to address various measured non-conformities/defects to correct or ameliorate the non-conformities/defects. The active interdiction control system will thereby control one or more of the processing modules and the processing sequence to achieve the desired results of the invention, which may be referred to as the target conditions or predetermined thresholds.

The active interdiction control system also can control the transfer modules in order to move the workpieces to upstream and/or downstream processing modules when non-conformities/defects are detected. That is, depending upon what is detected, the system of the invention may move the workpiece further along in the processing sequence, or may direct the workpiece to a correction module or to an upstream processing module to correct or otherwise address a detected non-conformity or defect. As such, feedforward and feedback mechanisms are provided through the transfer modules to provide the active interdiction of the invention.

Furthermore, the processing sequence might be affected upstream or downstream for future workpieces.

The active interdiction features of the invention improve performance, yield, throughput, and flexibility of the manufacturing process using run-to-run, wafer-to-wafer, within the wafer and real-time process control using collected measurement/metrology data. The measured data is collected, in real time during the processing, without removing the workpiece/substrate/wafer from the controlled processing environment. In accordance with one feature of the invention, in a common manufacturing platform, for example, the measurement data may be captured while the substrate remains in a controlled environment, such as under vacuum, for example. That is, the workpiece transfer module(s) can be configured for transferring the workpiece between the plurality of processing modules and the measurement modules without leaving the controlled environment. The active interdiction control can provide a multivariate, model-based system that is developed in conjunction with feed-forward and feedback mechanisms to automatically determine the optimal recipe for each workpiece based on both incoming workpieces and module or tool state properties. The active interdiction control system uses fabrication measurement data, process models and sophisticated control algorithms to provide dynamic fine-tuning of intermediate process targets that enhance final device targets. The interdiction system enables scalable control solutions across a single chamber, a process tool, multi-tools, a process module and multi-process modules on a common manufacturing platform using similar building blocks, concepts, and algorithms as described herein.

Referring again to FIG. 3, FIG. 3 is a schematic diagram of another system for implementing an embodiment of the present invention on first common manufacturing platform 300. The platform 300 incorporates a plurality of processing modules/systems for performing integrated workpiece processing and workpiece measurement/metrology under the control of an active interdiction control system 322 according to embodiments of the invention. FIG. 3 illustrates an embodiment of the invention wherein one or more workpiece measurement modules are coupled together with one or more workpiece processing modules through one or more transfer modules. In that way, in accordance with features of the invention, an inspection of the workpiece may be made to provide the measurement data associated with an attribute of the workpiece, such as regarding material properties of the workpiece and the various thin films, layers and features that are formed on the workpiece while the workpiece remains within the common manufacturing platform. As discussed herein, measurements and analysis may be made immediately upon completion of processing steps, such as an etch or deposition step, and the measurement data gathered may be analyzed and then used within the common manufacturing platform to address any measurements or features that are out of specification or non-conformal or represent a defect with respect to the workpiece design parameters. The workpiece does not need to be removed from the common manufacturing platform to take corrective action, but rather, can remain under the controlled environment.

Referring to FIG. 3, common manufacturing platform 300 is diagrammatically illustrated. Platform 300 includes the front-end module 302 for introducing one or more workpieces into the manufacturing platform. As is known, the front-end module (FEM) may incorporate one or more cassettes holding the workpieces. The front-end module may be maintained at atmospheric pressure but purged with an inert gas to provide a clean environment. One or more workpieces may then be transferred into a transfer module 310, such as through one or more load-lock chambers (not shown) as discussed herein. The transfer modules of FIG. 3 are transfer measurement modules (TMM) that include measurement tools or inspection systems integrated therein for capturing data from a workpiece. Multiple TMM's 310 may be interfaced for providing movement of a workpiece through a desired sequence. The transfer measurement modules 310 are coupled with a plurality of processing modules. Such processing modules may provide various different processing steps or functions and may include one or more etch modules 330, one or more film-forming modules 320, one or more cleaning modules 340, and one or more measurement modules 312a, 312b, 312c, 312d. In accordance with embodiments of the invention as disclosed further herein, measurement modules may be accessed through the transfer modules 310 before or after each processing step. In one embodiment, the measurement modules, such as 312c, 312d, are located outside of the transfer modules 310 and are accessed to insert and receive workpieces similar to the various processing modules and may be referred to herein as metrology modules that reside within the controlled environment of the first common manufacturing platform 300. Alternatively, measurement modules or at least a portion thereof, such as modules 312a, 312b, may be located in a respective transfer module. More specifically, all or a portion of a measurement module 312a, 312b is located in a transfer module 310 to define a measurement region therein where a workpiece might be positioned for measurement during a transfer process. The measurement region is located in a dedicated area of the transfer module 310 and is accessible by the transfer mechanism of the transfer module for positioning the workpiece. As noted, this makes the transfer module essentially a transfer measurement module (TMM) as discussed herein.

Generally, the transfer module defines a chamber therein that houses a transfer robot that is capable of moving workpieces, under vacuum, through various gate valves and access or transfer ports into various processing modules or measurement modules. By maintaining the measurement modules on the first common manufacturing platform 300, they are readily accessed, such as between one or more of the processing steps to provide the necessary measured analytical data on-the-fly that will be used to address any workpiece out of specification or otherwise non-conformal with the workpiece design plans for a particular workpiece or to address detectable defects. In that way, real time data is provided to allow a fabricator to recognize problems early in the system so that remedial action may be taken in the current processing sequence, such as in a following processing step, in a previous processing step, and/or in a future processing step depending upon the captured data and the detected non-conformities or defects. In that way, productivity and efficiency may be increased, process monitoring overhead may be reduced, and wasted product, in the form of rejected or ejected workpieces may be reduced. This all provides a significant cost savings to a fabricator or device maker.

As noted, in one embodiment of the invention that incorporates the active interdiction control system 322, one or more measurement modules are hosted on a common manufacturing platform with processing modules for providing measured data regarding an attribute of the workpiece. The data is used by the active interdiction control system 322 for detecting non-conformities and for performing corrective processing of the workpiece when non-conformities are detected. The corrective processing is performed upstream and/or downstream in the process sequence when non-conformities are detected. Again, as indicated above, it is understood that the second common manufacturing platform 360 and/or ancillary module 350 can include a metrology module(s), such as metrology module 372a, and advantageously include an "active interdiction system" like the first common manufacturing platform 300, as discussed in detail above.

FIGS. 5A-5K illustrate schematic cross-sectional diagrams illustrating an embodiment of a fully self-aligned via formation method for a workpiece 500. FIG. 6 is a flow chart of a process flow 600 corresponding to the method of FIGS. 5A-5K. As explained above, FIG. 3 illustrates an embodiment of an arrangement of a first common manufacturing platform 300 together with an ancillary module 350 and a second common manufacturing platform 360 that may be used for performing process flow 200. The embodiment of FIG. 3 similarly may be used for performing process flow 600. To that end, the process flow 600 of FIG. 6 and the common manufacturing platforms 300, 360, and the ancillary module 350 will be referenced throughout the following sequential discussion of FIGS. 5A-5K in which workpiece 500 is described as it proceeds through a sequence of processing steps.

Figure 5A:
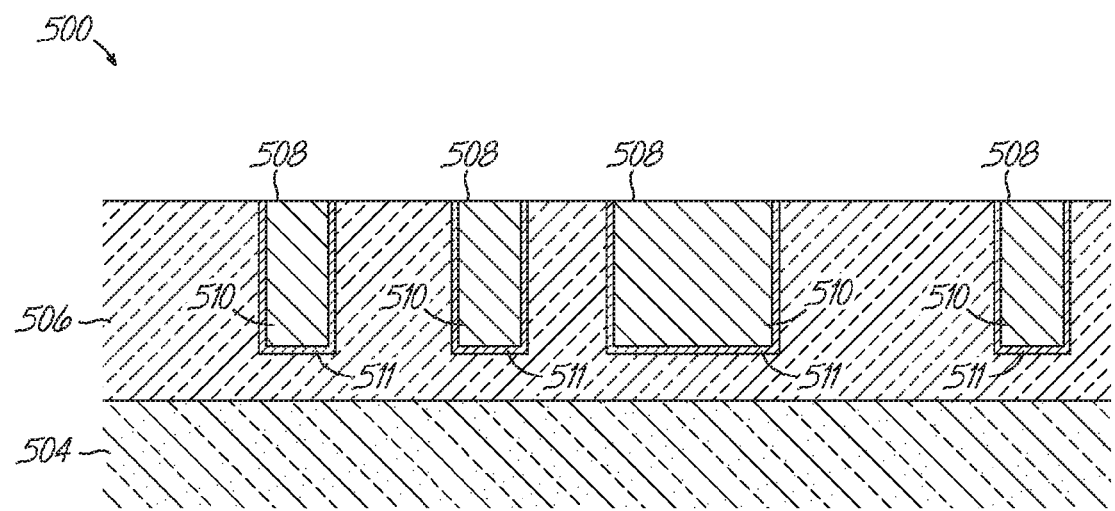
FIGS. 5A-5K are schematic cross-sectional diagrams illustrating one embodiment of a fully self-aligned via formation method.
Figure 6:
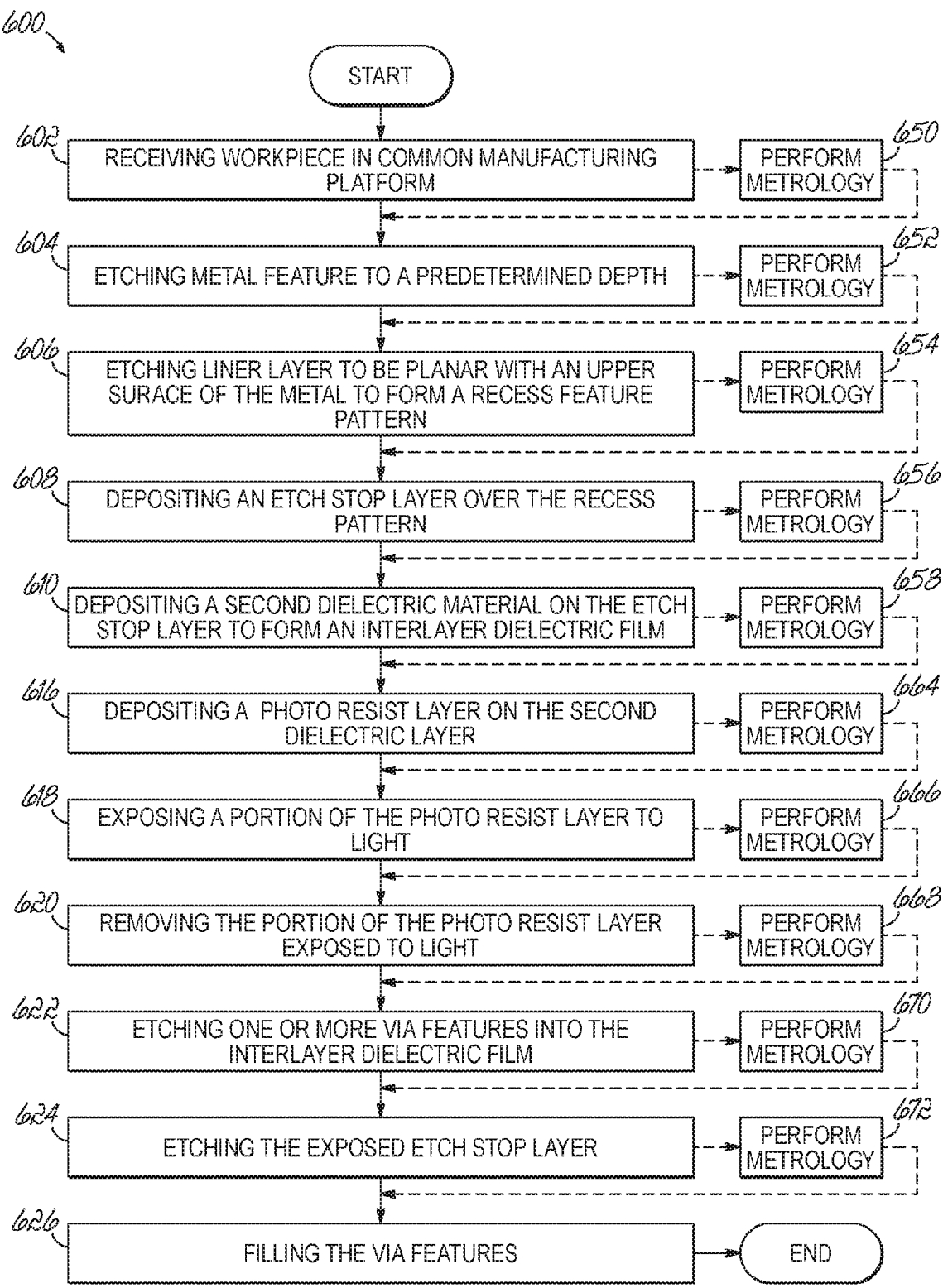
FIG. 6 is a flow chart diagram illustrating one embodiment of an integrated process flow for fully self-aligned via formation.

In operation 602 of process flow 600 and as shown in FIG. 5A, a workpiece 500 having a pattern of metal features 510 in an underlying layer 506 is provided into the first common manufacturing platform 300. The workpiece 500 includes the pattern of metal features 510 and the underlying layer 506 positioned on the substrate 504. To those familiar in the current art, different schemes are known for creating a pattern of metal features 510 on a substrate. For simplicity, workpiece 500 is depicted with a substrate 504 having an underlying layer 506 thereon, although it may be understood that the structure on which the metal features 510 are formed may be a multi-layer structure of which the underlying layer 506 is just one of multiple layers.

The underlying layer 506 may be an oxide layer including silicon oxide, silicon dioxide, a carbon doped silicon oxide, a porous carbon doped silicon oxide, or some other oxide of silicon. In the case of a porous oxide, a pore sealing process may be performed prior to operation 604 (not shown). Alternatively or in addition, the underlying layer 506 may be a dielectric layer.

The metal features 510 may include, but is not limited to copper, ruthenium, cobalt, tungsten, or combinations thereof. Additionally, a liner layer 511 is included in the recessed feature along with the metal material in the metal features 510. The liner layer 511 may include tantalum nitride, and inhibits the metal from contacting the oxide and/or dielectric material in the underlying layer 506. The liner layer 511 may serve to bond the metal material in the metal feature 510 to the underlying layer 506. Alternatively or in addition, the liner layer 511 may serve to prevent the metal material in the metal feature 510 from diffusing into the underlying layer 506.

As shown in FIG. 3, a front end module (FEM) 302 or a transfer module 310a may be used to bring the workpiece into the controlled environment of the first common manufacturing platform 300, which controlled environment is maintained throughout at least a portion of the process flow 600. The controlled environment may include a vacuum environment, where at least some operations in the process flow 600 are conducted in sequence without breaking vacuum, or an inert gas atmosphere, or a combination thereof. A single transfer module may be coupled between each processing module or tool, such as each of transfer modules 310a, 310b shown in FIG. 3, or separate transfer modules may be used for each tool transfer. Transfer modules 310a-b may be collectively referred to herein as transfer modules 310 where appropriate. Where different processing modules on the first common manufacturing platform 300 require different controlled environments, such as different vacuum pressures or vacuum in one module followed by a module with inert gas atmosphere, multiple transfer modules 310 may be used where the transfer modules 310 assist in implementing the transitions between the different controlled environments. While a single transfer module may be useful in a cluster-type tool where same-type processing modules are positioned in a circle around the transfer module, multiple transfer modules 310 may be more appropriate in an end-to-end platform configuration with different processing module types such as that depicted in FIG. 3. However, the embodiments herein do not preclude an end-to-end platform configuration that utilizes a single transfer module that is coupled to each of the processing modules, or some configuration in between, for example, a common transfer module for adjacent same-type processing modules that are used in sequence.

A front-end module 302 may be used to load a cassette of workpieces (not shown), sequentially line up the workpieces and insert them into a load lock, then into a transfer module 310a in a controlled environment, and the transfer module 310a sequentially loads the workpieces into a processing module. In the first common manufacturing platform 300, in operation 602, the workpiece 100, which has been received into the controlled environment, is loaded by the transfer module 310a into a film-forming module 320a or 320b hosted on the first common manufacturing platform 300. Film-forming modules 320a, 320b may be collectively referred to herein as film-forming modules 320 where appropriate. Similarly, etching modules 330a, 330b may be collectively referred to herein as etching modules 330 where appropriate. Similarly, metrology modules 312a-d may be collectively referred to herein as metrology modules 312 where appropriate. Similarly, cleaning modules 340a, 340b may be collectively referred to herein as cleaning modules 340 where appropriate.

Figure 5B:
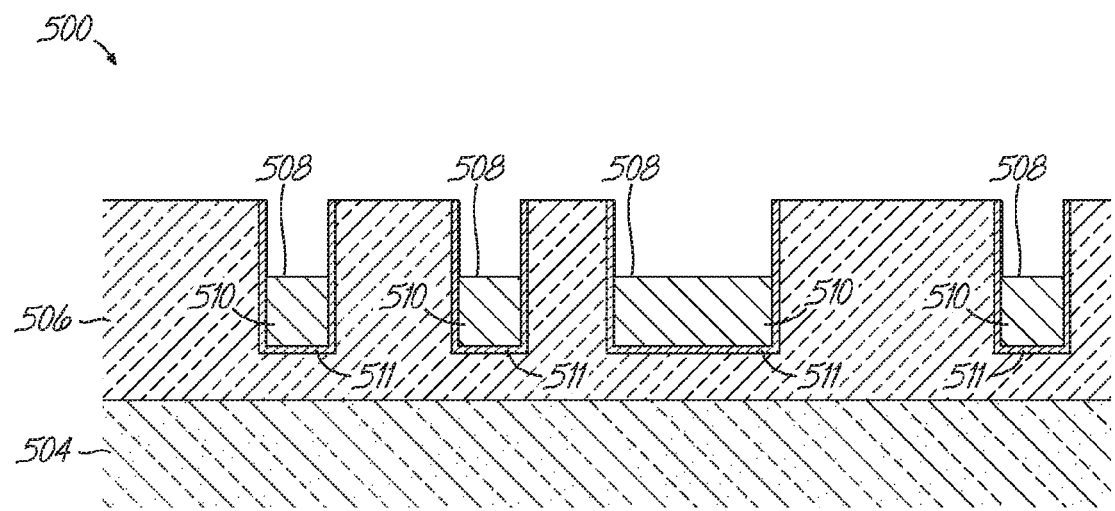

Referring to FIGS. 5B, 6, and 3, in operation 604, in the etching module 330, the metal features 510 are etched such that the exposed surface 508 is lowered or recedes into the workpiece 500. The thus-lowered exposed surfaces 508 of the metal features 510 form a recess pattern on the workpiece 500 together with the liner layer 511.

Then, without leaving the controlled environment, e.g., without breaking vacuum, the workpiece 500 may stay in the same etching module 330 or be transferred using transfer modules 310 to a different etching module 330, such as etching module 330b. Adjustments to the controlled environment may be made in transfer modules 310a and 310b if the etching module 330 for a subsequent operation operates with different parameters than the etching module from used in a current or previous operation, such as different vacuum pressures.

Figure 5C:
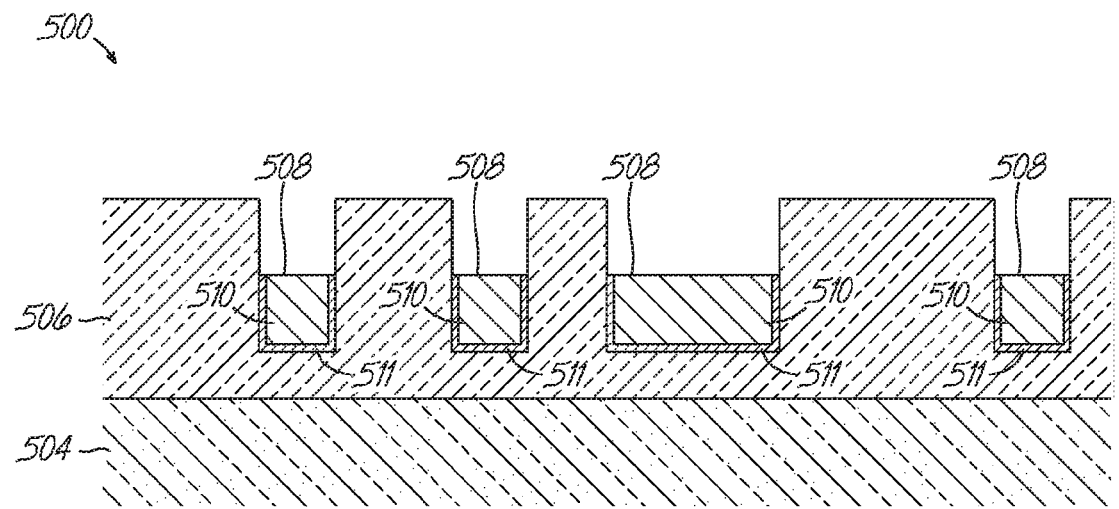

Referring to FIGS. 5C, 6, and 3, in operation 606, in the etching module 330, the liner layers 511 are etched to lower the liner layers 511 into the workpiece 500. The liner layers 511 are lowered such that the upper edge of the liner layers 511 is coplanar with the exposed surface 508 or the lowered metal features 510. The thus-lowered liner layers 511 and metal features 510 form a recess pattern on the workpiece 500.

Then, without leaving the controlled environment, e.g., without breaking vacuum, transfer modules 310a and 310b may be used to transfer the workpiece 100 to the film-forming module 520 such as film-forming module 520a also hosted on the first common manufacturing platform 300, e.g., transfer module 310a removes the workpiece 100 from first etching module 330a and delivers the workpiece 500 into the film-forming module 320a. Adjustments to the controlled environment may be made in transfer modules 310a and 310b if film-forming module 320 operates with different parameters than the etching module 330, such as different vacuum pressures.

Figure 5D:
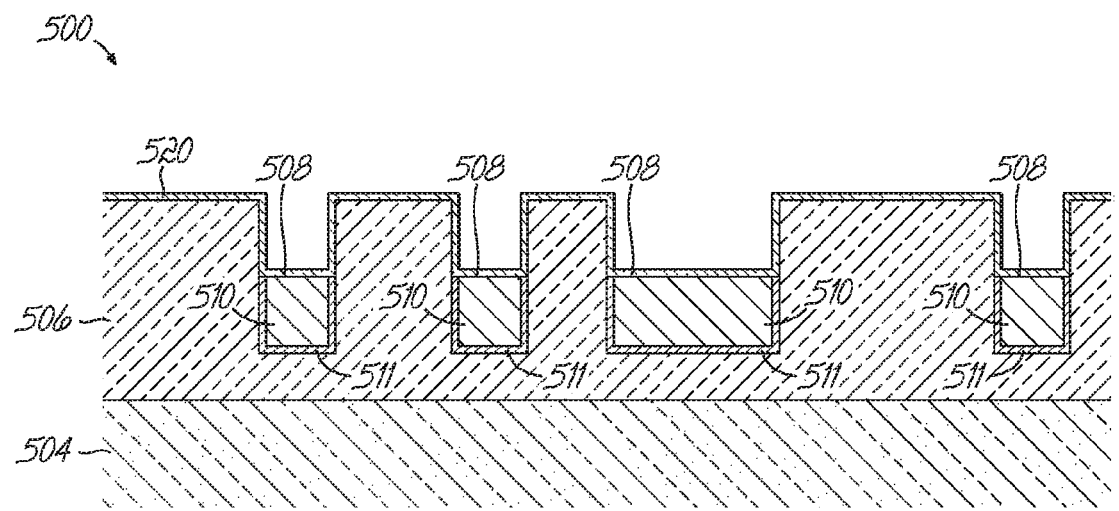

Thereafter, and again without leaving the controlled environment, e.g., without breaking vacuum, in operation 608, with reference to FIGS. 5D, 6, and 3, an etch stop layer 520 is deposited over the recessed pattern features using one or more of the film-forming modules 320. The etch stop layer 520 may include nitrided films with metals, for example tantalum nitride, or dielectric materials, for example silicon nitrides. The deposition of the etch stop layer 520 may be performed in the same film-forming module as previous operations.

Then, without leaving the controlled environment, e.g., without breaking vacuum, transfer modules 310a and 310b may be used to transfer the workpiece 500 to the same or a different film-forming module 320 such as film-forming module 320b also hosted on the first common manufacturing platform 300, e.g., transfer module 310a removes the workpiece 500 from film-forming module 320a and transfers it to film-forming module 320b. Adjustments to the controlled environment may be made in transfer modules 310a and 310b if, for example, the second film-forming module 320b operates with different parameters than, for example, the first film module 320a, such as different vacuum pressures.

Figure 5E:
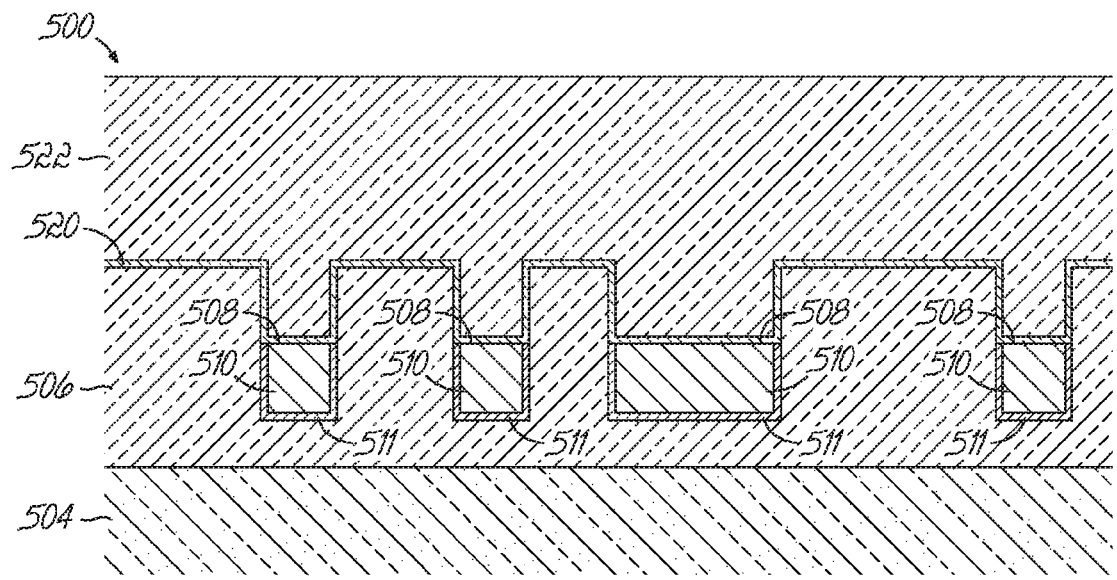

Thereafter, and again without leaving the controlled environment, e.g., without breaking vacuum, in operation 610, with reference to FIGS. 5E, 6, and 3, a second dielectric layer of dielectric material is deposited over the etch stop layer 520 using one or more of the film-forming modules 320, forming an interlayer dielectric film 522. The interlayer dielectric film 522 may include the same material as the underlying layer 506. For example, the interlayer dielectric film 522 may include an oxide of silicon. The deposition of the interlayer dielectric film 522 may be performed in the same film-forming module as any previous operation.

Figure 5F:
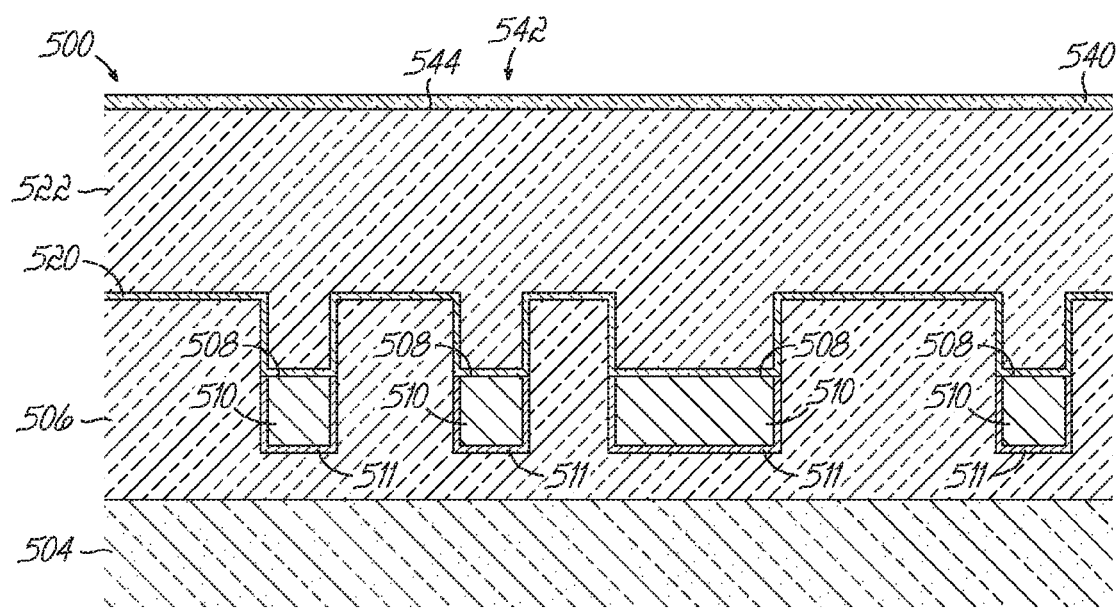

Then, in operation 616, with reference to FIGS. 5F, 6, and 3, the workpiece 500 is transferred to the ancillary module 350 for further processing. The ancillary module 350 does not operate in the controlled environment. The ancillary module 350 may include track module 354 and lithography module 352. The workpiece 100 is transferred from the first common manufacturing platform 300 to the ancillary module 350, leaving the controlled environment and breaking the vacuum of the first common manufacturing platform 300. In some examples, the workpiece 500 is transferred to the track module 354. A photo resist layer 540 is spun onto the upper surface of the workpiece 500, specifically the upper surface of the interlayer dielectric film 522, in the track module 354. The photo resist layer 540 is a light sensitive layer and is spun onto the upper surface of the workpiece 500 such that the photo resist layer 540 is uniform and covers the upper surface of the workpiece 500, as shown in FIG. 5F.

Figure 5G:
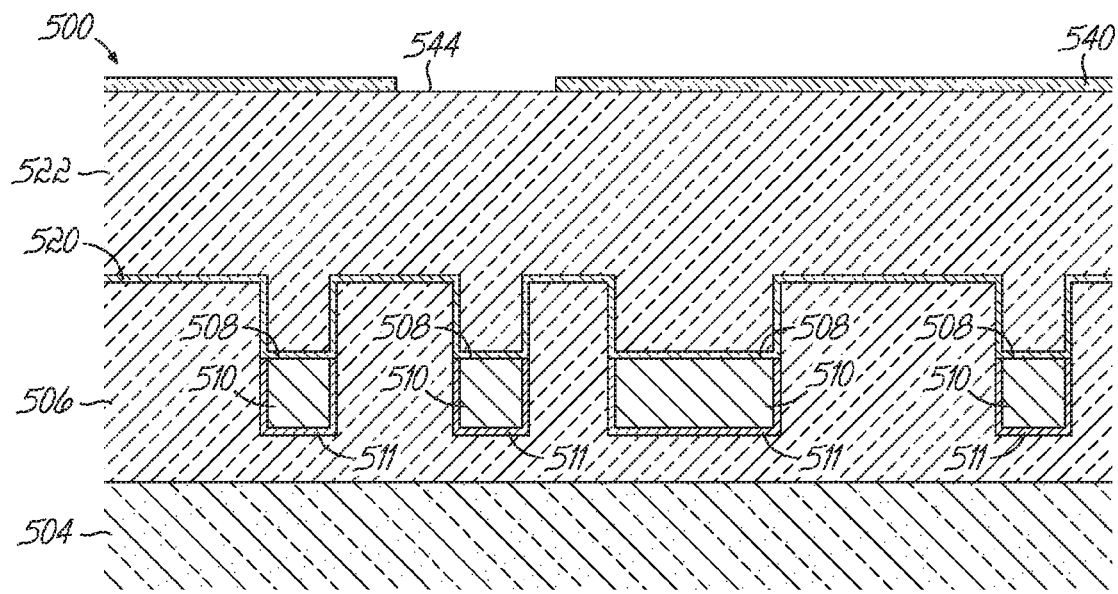

Then, in operation 618, with further reference to FIGS. 5G, 6, and 3, the workpiece 500 is transferred to the lithography module 352. In some examples, such as the ancillary module 350 shown in FIG. 3, the lithography module 352 may share a common module, such as the ancillary module 350, with the track module 354. Alternatively, the lithography module 352 may be a completely or partially separate module from the track module 354. In the lithography module 352, a mask (not shown) covers portions of the photo resist layer 540 such that portions not covered by the mask are exposed. For example, as shown in FIG. 5F, the exposed portion 542 may be left exposed by the mask. The exposed portion 542 of the photo resist layer 540 is subjected to light in the lithography module 352. The light weakens the portion of the photo resist layer 540 that the light contacts, namely the exposed portion 542 of the photo resist layer 540. The mask covers the remainder of the photo resist layer 540 and prevents portions other than the exposed portion 542 from being exposed to light in the lithography module 352. Thus, only the exposed portion 542 of the photo resist layer 540 is weakened by exposure to the light in the lithography module 352.

Then, in operation 620, with reference to FIGS. 5G, 6, and 3, the workpiece 500 is developed in a baking process. The baking process removes the exposed portion 542 from the workpiece 500. As shown in FIG. 5G, the baking process results in the removal of the exposed portion 542 (not shown in FIG. 5G because it was removed in the bake) and exposes a portion 544 of the upper surface of the interlayer dielectric film 522.

Then, the workpiece 500 is transferred back to a controlled environment. This controlled environment may be present on a common manufacturing platform. This common manufacturing platform may be the same or different common manufacturing platform in which operations 602-610 were performed, that is the first common manufacturing platform 300. Alternatively, the workpiece 500 may be transferred to the second common manufacturing platform 360, which occurs here.

As shown in FIG. 3, the second common manufacturing platform 360 includes a front end module (FEM) 362 or a transfer module 370a that may be used to bring the workpiece 100 into the controlled environment of the second common manufacturing platform 360, which controlled environment is maintained throughout at least a portion of the process flow 600. The controlled environment may include a vacuum environment, where at least some operations in the process flow 600 is conducted without breaking vacuum, or an inert gas atmosphere, or a combination thereof. A single transfer module, such as transfer module 370a, may be coupled between each processing module or tool, or separate transfer modules may be used for each tool transfer. Where different processing modules on the second common manufacturing platform 360 require different controlled environments, such as different vacuum pressures or vacuum in one module followed by a module with inert gas atmosphere, multiple transfer modules may be used where the transfer modules assist in implementing the transitions between the different controlled environments. While a single transfer module may be useful in a cluster-type tool where same-type processing modules are positioned in a circle around the transfer module, multiple transfer modules may be more appropriate in an end-to-end platform configuration with different processing module types.

A front-end module 362 may be used to load a cassette of workpieces (not shown), sequentially line up the workpieces and insert them into a load lock, then into a transfer module 370a in a controlled environment, and the transfer module 370a sequentially loads the workpieces into a processing module. In the second common manufacturing platform 360, and with respect to operation 622, the workpiece 500, which has been received into the controlled environment, is loaded by the transfer module 370a into an etching module 390, such as first etching module 390b, hosted on the second common manufacturing platform 360 without leaving the controlled environment, e.g., without breaking vacuum. Etching modules 390a, 390b located on the second common manufacturing platform 360 may be collectively referred to herein as etching modules 390 where appropriate. Similarly, deposition modules 380a, 380b may be collectively referred to herein as deposition modules 380 where appropriate. Adjustments to the controlled environment may be made in transfer module 370a if etching module 390 operates with different parameters than the front end module 362, such as different vacuum pressures.

Figure 5H:
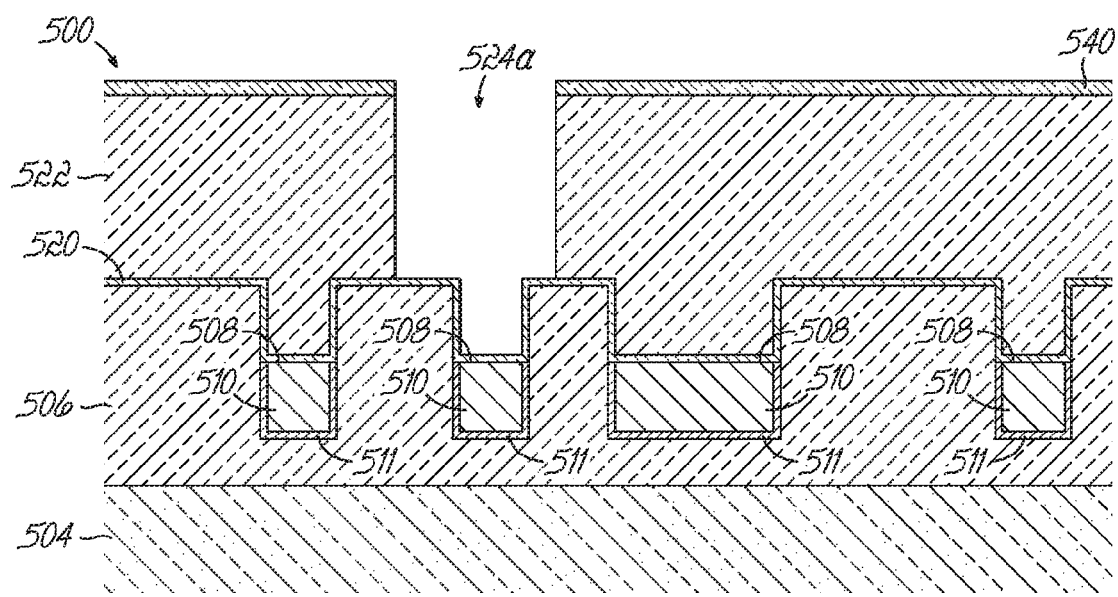

Thereafter, and without leaving the controlled environment, e.g., without breaking vacuum, in operation 622, with reference to FIGS. 5H, 6, and 3, the exposed portion 544 of the interlayer dielectric film 522 is etched to form one or more via features 524a. The via features 524a are formed by etching the interlayer dielectric film 522 to the etch stop layer 520 using one of the one or more etching modules 330. As a result, the etch stop layer 520 is exposed at the bottom of the one or more via features 524a, as shown in FIG. 5H. Exposure of the etch stop layer 520 may serve as an indication for the etching module 330 to stop etching deeper into the workpiece 500 toward the substrate 504.

Then, without leaving the controlled environment, e.g., without breaking vacuum, transfer module 370a may be used to transfer the workpiece 500 to the etching module 390 such as etching module 390b also hosted on the second common manufacturing platform 360, e.g., transfer module 370a removes the workpiece 500 from etching module 390a and delivers the workpiece 500 into the etching module 330b. Adjustments to the controlled environment may be made in transfer modules 370a if etching module 390b operates with different parameters than etching module 390a, such as different vacuum pressures.

Figure 5I:
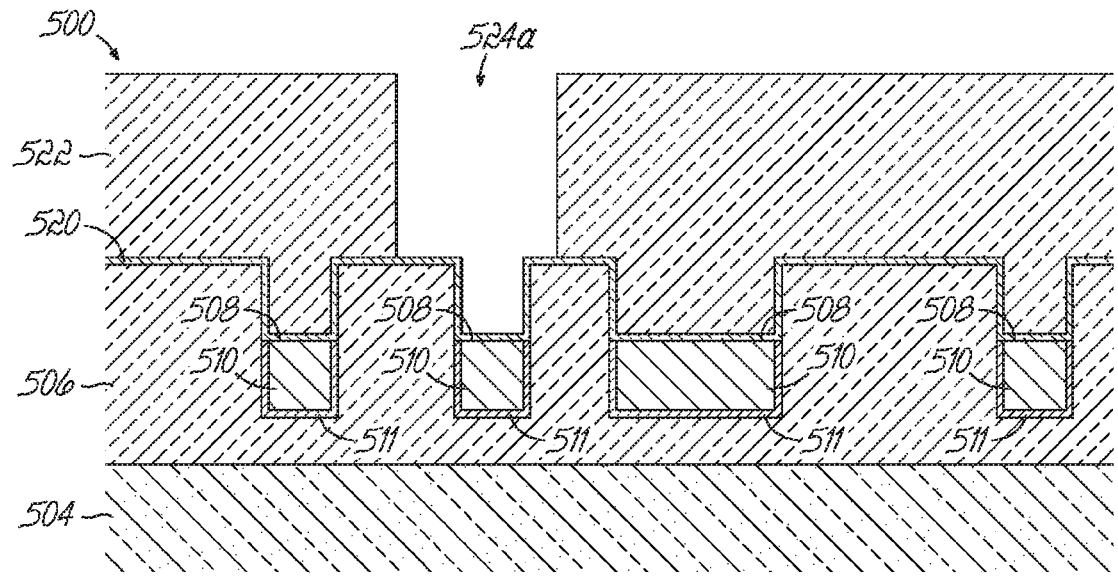

Thereafter, and again without leaving the controlled environment, e.g., without breaking vacuum, with reference to FIGS. 5I, and 3, the photo resist layer 540 is etched from the upper surface of the interlayer dielectric 522, such as within second etching module 390b. As a result, the upper surface of the interlayer dielectric 522 is exposed and prepared for deposition of metal feature material.

Figure 5J:
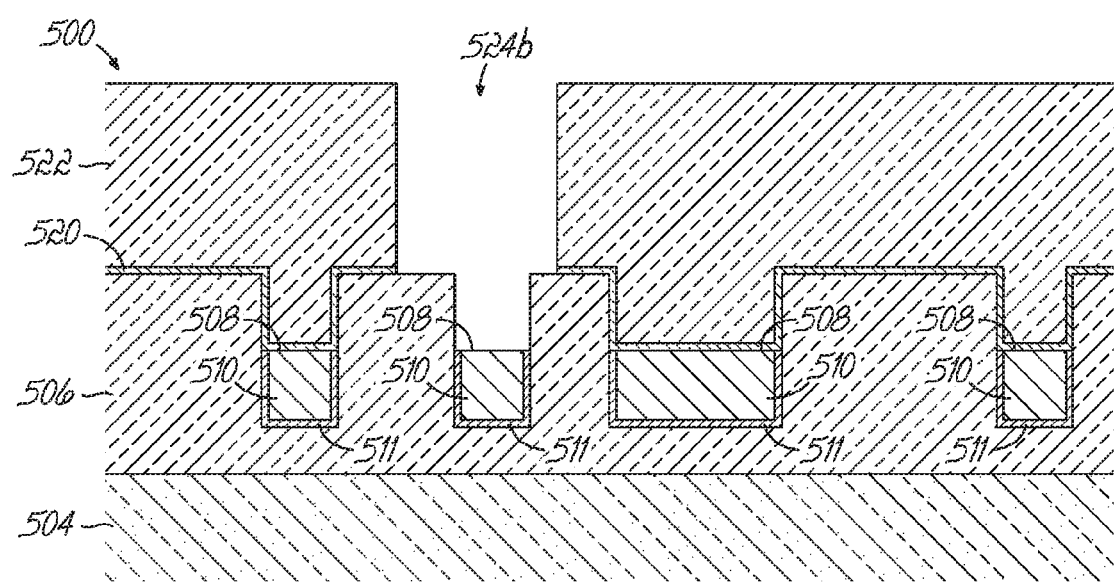

Thereafter, and again without leaving the controlled environment, e.g., without breaking vacuum, in operation 624, with reference to FIGS. 5J, 6, and 3, the exposed etch stop layer 520 is etched to further form one or more via features 524b. The via features 524b are formed by etching the exposed etch stop layer 520 using one of the one or more etching modules 390. As a result, at least some of the metal features 510 are exposed at the bottom of the one or more via features 524b, as shown in FIG. 5J. Exposure of the metal features 510 may serve as an indication for the etching module 390 to stop etching deeper into the workpiece 500 toward the substrate 504.

Then, without leaving the controlled environment, e.g., without breaking vacuum, transfer modules 370a may be used to transfer the workpiece 500 to the film-forming module 380 such as film-forming module 380a or 380b also hosted on the second common manufacturing platform 360, e.g., transfer module 370a removes the workpiece 500 from etching module 390 and delivers the workpiece 500 into the film-forming module 380a or 380b. Adjustments to the controlled environment may be made in transfer module 370a if the film-forming module 380 operates with different parameters than etching module 390, such as different vacuum pressures.

Figure 5K:
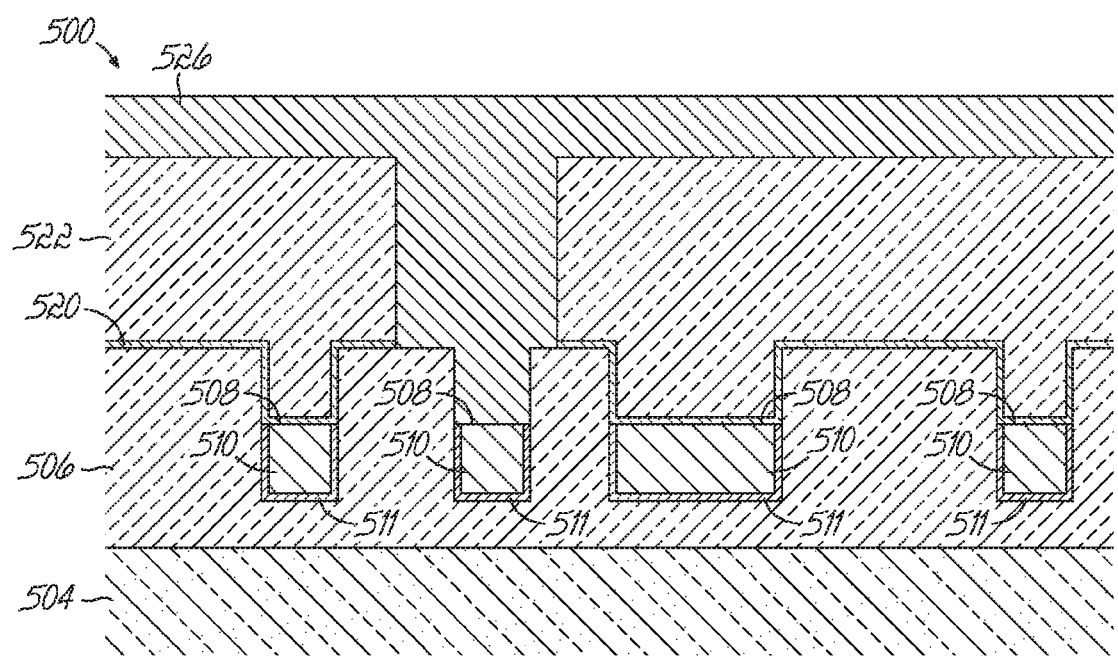

Thereafter, and again without leaving the controlled environment, e.g., without breaking vacuum, in operation 626, with reference to FIGS. 5K, 6, and 3, a metal 526 is deposited into the via features 524b using the film-forming module 320. The via feature 524b is filled with the metal 526 over the metal features 510 in the film-forming module 320. In some examples, the metal 526 is selected from the group consisting of ruthenium, tungsten, cobalt, copper, and combinations thereof.

Optionally, the workpiece 500 may be subjected to one or more cleaning processes before further patterning operations. For example, cleaning may be performed in the same cleaning module 340a, 340b hosted on the first common manufacturing platform 300. A transfer module 310 may be used to transfer the workpiece 500 from the film-forming module 380 to, for example, the first common manufacturing platform 300, and then to the cleaning module 340. As shown, transfer modules 310a, 310b, 370a may be used to make the transfer. For example, the transfer module 370a may remove the workpiece from the film-forming module 380a, and eventually transfer it to the transfer module 310b, which then delivers the workpiece into the cleaning module 340. Again, the first common manufacturing platform 300 may include two identical cleaning modules 340 on the same or opposing sides of the transfer module 310b. It should be understood that second common manufacturing platform 360 and/or ancillary module 350 also may include one or more cleaning module so that cleaning may be performed therein.

The process flow 600 of FIG. 6 will now be described in detail with the optional metrology operations. Operation 602 includes receiving the workpiece into the first common manufacturing platform 300, the workpiece having a pattern of metal features in a dielectric layer wherein exposed surfaces of the metal features and exposed surfaces of the dielectric layer together define an upper planar surface. Operation 650 includes optionally performing metrology to obtain measurement data related to attributes of the incoming workpiece, such as attributes of the metal features, layout of the metal feature pattern, and underlying layer within which metal features are formed, which measurement data may be used to adjust and/or control process parameters of any one of operations 602-626.

Operation 604 includes etching the metal features to a predetermined depth. Operation 652 includes optionally performing metrology to obtain measurement data related to attributes of the workpiece having the metal features etched to the predetermined depth, such as attributes of the metal features, the depth of the metal features, and/or the underlying layer into which the metal features are formed as affected by the depth of the metal features, which measurement data may be used to adjust and/or control process parameters of any one of operations 602-626 or may be used to repair the workpiece before continued processing. In one embodiment, when the measurement data indicates that one or more attributes do not meet a target condition, the workpiece may be transferred to a correction module to repair the selectively applied metal caps. For example, when a depth or uniformity of metal features does not meet a target depth or uniformity, corrective action may be taken in one or more correction modules, such as further etching of the metal features, metal deposition to raise the metal features, or a combination of two or more thereof.

Operation 606 includes etching the liner layer, using one of the one or more etching modules. Operation 654 includes optionally performing metrology to obtain measurement data related to attributes of the workpiece having the liner layer etched to the predetermined depth, such as attributes of the liner layer, the depth of the liner layer, and/or the planarity of the liner layer with an edge of the metal features. Measurement data may be used to adjust and/or control process parameters of any one of operations 602-626 or may be used to repair the workpiece before continued processing. In one embodiment, when the measurement data indicates that one or more attributes do not meet a target condition, the workpiece may be transferred to a correction module to repair the selectively applied metal caps. For example, when a depth, uniformity, or planarity of the liner layers does not meet a target depth, uniformity, or planarity, corrective action may be taken in one or more correction modules, such as further etching of the liner layer, liner layer deposition to raise the liner layer, or a combination of two or more thereof.

Operation 608 depositing an etch stop layer over the recess pattern using one of the one or more film-forming modules. Operation 656 includes optionally performing metrology to obtain measurement data related to attributes of the workpiece having the etch stop layer formed thereon, such as attributes of the workpiece having the etch stop layer formed thereon, the recess pattern as affected by the etch stop layer, and/or the underlying layer as affected by the etch stop layer, which measurement data may be used to adjust and/or control process parameters of any one of operations 602-626, may be used to make adjustments for subsequent workpieces to the incoming attributes of the workpieces in operation 602 or to operations 604-626, or may be used to repair the workpiece before continued processing. In one embodiment, when the measurement data indicates that one or more attributes do not meet a target condition, the workpiece may be transferred to a correction module to repair the etch stop layer over the recess pattern. For example, when the thickness, width, or profile of the etch stop layer does not meet a target thickness, width, or profile of the etch stop layer, corrective action may be taken in one or more correction modules, such as by selectively depositing additional material onto the recess pattern, reshaping the etch stop layer, etching a portion of the etch stop layer, or a combination of two or more thereof.

Operation 610 includes depositing a second dielectric material on the etch stop layer to form an interlayer dielectric film over and/or in the recess pattern using one of the one or more film-forming modules Operation 658 includes optionally performing metrology to obtain measurement data related to attributes of the workpiece having the second dielectric material, such as attributes of the etch stop layer as affected by the second dielectric material and/or the underlying layer as affected by the second dielectric material, which measurement data may be used to adjust and/or control process parameters of operation 610, may be used to make adjustments for subsequent workpieces to the incoming attributes of the workpieces in operation 602 or to operations 604-626, or may be used to repair the workpiece before continued processing. In one embodiment, when the measurement data indicates that one or more attributes do not meet a target condition, the workpiece may be transferred to a correction module to repair the interlayer dielectric film. For example, when the thickness, width, or profile of the interlayer dielectric film does not meet a target thickness, width, or profile of the interlayer dielectric film, corrective action may be taken in one or more correction modules, such as by selectively depositing additional second dielectric material onto the etch stop layer, etching the second dielectric material, or a combination of two or more thereof.

Hereinafter, measurement data may continue to be obtained during the sequence of processing steps related to the formation of the fully self-aligned via. But here, if measurement data is going to be obtained utilizing the first common manufacturing platform 300, workpieces will need to be transferred between platforms 300, 360 and/or ancillary module 350. In certain embodiments, it is contemplated that the second common manufacturing platform 360 and/or ancillary module 350 can include their own metrology module(s), e.g., metrology module 372a, and advantageously include their own "active interdiction system". In that instance, measurement data may continue to be obtained within a controlled environment at least with respect to the second common manufacturing platform 360 and as associated with its own corresponding sequence of processing steps, for example Operation 616 includes depositing a photo resist layer on the interlayer dielectric film. Operation 668 includes optionally performing metrology to obtain measurement data related to attributes of the workpiece having the photo resist layer deposited thereon, such as attributes of the etch stop layer as affected by the photo resist layer and/or the underlying layer as affected by the photo resist layer, which measurement data may be used to adjust and/or control process parameters of operations 616, may be used to make adjustments for subsequent workpieces to the incoming attributes of the workpieces in operation 602 or to operations 604-626, or may be used to repair the workpiece before continued processing. In one embodiment, when the measurement data indicates that one or more attributes do not meet a target condition, the workpiece may be transferred to a correction module to repair the photo resist layer. For example, when the thickness, width, uniformity, or profile of the photo resist layer does not meet a target thickness, width, uniformity, or profile of the interlayer dielectric film, corrective action may be taken in one or more correction modules, such as by selectively depositing additional photo resist layer material onto the workpiece, etching the photo resist layer, or a combination of two or more thereof.

Operation 618 includes exposing a photo resist layer to light at least to weaken the photo resist layer. Operation 670 includes optionally performing metrology to obtain measurement data related to attributes of the workpiece having the photo resist layer deposited thereon, such as attributes of portions of the photo resist layer as affected by the light exposure. This measurement data may be used to adjust and/or control process parameters of operations 620, may be used to make adjustments for subsequent workpieces to the incoming attributes of the workpieces in operation 602 or to operations 604-626, or may be used to repair the workpiece before continued processing. In one embodiment, when the measurement data indicates that one or more attributes do not meet a target condition, the workpiece may be transferred to a correction module to repair the photo resist layer. For example, when the specific portions or desired weakness of the photo resist layer does not meet a target specific portions or desired weakness of the photo resist layer, corrective action may be taken in one or more correction modules, such as by selectively depositing additional photo resist layer material onto the workpiece, etching the photo resist layer, further exposing portions of the photo resist layer to light, or a combination of two or more thereof.

Operation 620 includes baking or developing a portion of the photo resist layer on the interlayer dielectric film.

Operation 672 includes optionally performing metrology to obtain measurement data related to attributes of the workpiece having the photo resist layer deposited thereon, such as attributes of the photo resist layer and/or attributes of the interlayer dielectric film as affected by the photo resist layer, which measurement data may be used to adjust and/or control process parameters of operations 620, may be used to make adjustments for subsequent workpieces to the incoming attributes of the workpieces in operation 602 or to operations 604-626, or may be used to repair the workpiece before continued processing. In one embodiment, when the measurement data indicates that one or more attributes do not meet a target condition, the workpiece may be transferred to a correction module to repair the photo resist layer. For example, when the portions of the photo resist layer removed in the baking/development process do not meet a target portion removed, corrective action may be taken in one or more correction modules, such as by selectively depositing additional photo resist layer material onto the workpiece, etching the photo resist layer, further exposing portions of the photo resist layer to light, or a combination of two or more thereof.

Operation 622 includes etching one or more via features through the interlayer dielectric to the etch stop layer using one of the one or more etching modules, the etch stop layer exposed at a bottom of the one or more via features and/or etching the photo resist layer from the interlayer dielectric film. Operation 664 includes optionally performing metrology to obtain measurement data related to attributes of the workpiece having the etched via features though the interlayer dielectric film, such as attributes of the etch stop layer as affected by the interlayer dielectric film material and/or the underlying layer as affected by the interlayer dielectric film material, which measurement data may be used to adjust and/or control process parameters of operation 622, may be used to make adjustments for subsequent workpieces to the incoming attributes of the workpieces in operation 602 or to operations 604-626, or may be used to repair the workpiece before continued processing. In one embodiment, when the measurement data indicates that one or more attributes do not meet a target condition, the workpiece may be transferred to a correction module to repair the interlayer dielectric film. For example, when the thickness, width, or profile of the interlayer dielectric film does not meet a target thickness, width, or profile of the interlayer dielectric film, corrective action may be taken in one or more correction modules, such as by selectively depositing additional second dielectric material onto the etch stop layer, etching the second dielectric material, or a combination of two or more thereof.

Operation 624 includes etching the exposed etch stop layer at the bottom of the one or more via features using one of the one or more etching modules to expose the metal caps at the bottom of the one or more via features. Operation 672 includes optionally performing metrology to obtain measurement data related to attributes of the workpiece having the etched via features though the etch stop layer, such as attributes of the etch stop layer as affected by the exposure of the metal cap and/or the underlying layer as affected by the exposure of the metal cap, which measurement data may be used to adjust and/or control process parameters of operation 624, may be used to make adjustments for subsequent workpieces to the incoming attributes of the workpieces in operation 602 or to operations 604-626, or may be used to repair the workpiece before continued processing. In one embodiment, when the measurement data indicates that one or more attributes do not meet a target condition, the workpiece may be transferred to a correction module to repair the via feature through the etch stop layer. For example, when the thickness, width, or profile of the via feature through the etch stop layer does not meet a target depth, width, or profile of the via feature, corrective action may be taken in one or more correction modules, such as by etching the etch stop layer.

Operation 626 includes filling the one or more via features over the metal caps with a metal using one of the one or more film-forming modules. Operation 626 may further include optionally performing metrology to obtain measurement data related to attributes of the workpiece having via feature filled over the metal caps, such as attributes of the via feature as affected by filling the one or more via features over the metal caps and/or the underlying layer as affected by filling the one or more via features over the metal caps, which measurement data may be used to adjust and/or control process parameters of operation 626, may be used to make adjustments for subsequent workpieces to the incoming attributes of the workpieces in operation 602 or to operations 604-626, or may be used to repair the workpiece before continued processing. In one embodiment, when the measurement data indicates that one or more attributes do not meet a target condition, the workpiece may be transferred to a correction module to repair the filling of the via feature. For example, when the thickness, width, or profile of the filled via feature does not meet a target depth, width, or profile of the via feature, corrective action may be taken in one or more correction modules, such as by depositing additional metal into the via feature, etching an overburdened filled via feature, or a combination of two or more thereof.

Process parameters, as referred to above, may include any operating variable within a processing module, such as but not limited to: gas flow rates; compositions of etchants, deposition reactants, purge gases, etc.; chamber pressure; temperature; electrode spacing; power; etc. The intelligence system of the active interdiction system is configured to gather measurement data from the inspection system and control the integrated sequence of processing steps executed on the common manufacturing platform, for example, by making in situ adjustments to processing parameters in subsequent processing modules for the workpiece in process, or by changing process parameters in one or more processing modules for subsequent workpieces. Thus, the obtained measurement data may be used to identify a needed repair to the workpiece during the integrated sequence of processing steps to avoid having to scrap the workpiece, and/or to adjust processing parameters for the integrated sequence of processing steps for steps performed on the same workpiece after the measurement data is obtained or for processing subsequent workpieces to reduce occurrences of the target conditions not being met for the subsequent workpieces.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A method of forming a self-aligned via on a semiconductor workpiece, the method comprising:
   receiving the workpiece comprising a pattern of metal features in a dielectric layer wherein exposed surfaces of the metal features and exposed surfaces of the dielectric layer together define an upper planar surface;

selectively depositing metal caps on the exposed surfaces of the metal features relative to the exposed dielectric material, the selectivity between the metal cap and the dielectric material being based, at least in part, on a higher metal cap layer deposition rate on the metal features than on the dielectric material;

selectively forming a barrier layer on the metal caps relative to the exposed dielectric material; the selectivity between the metal cap and the dielectric material being based, at least in part, on a higher barrier layer deposition rate on the metal caps than on the dielectric material;

selectively depositing a first dielectric material on the exposed surfaces of the dielectric layer to form a recess pattern in the first dielectric material, the selective deposition being based, at least in part, on a deposition rate of the first dielectric material being higher on the exposed surfaces than on the metal caps, the recess pattern comprising a sidewall including a portion of the first dielectric material;

treating the workpiece to expose the metal caps at bottom surfaces of the recess pattern; and depositing an etch stop layer over the recess pattern.

2. The method of claim 1, wherein the selective deposition comprises two or more deposition steps which apply 10 nm or less of the first dielectric material on the workpiece.

3. The method of claim 1, further comprising pre-treating the workpiece before depositing the metal caps to alter a surface termination of the first dielectric material, and wherein the pretreating is done in one or more pre-treatment modules on the common manufacturing platform.

4. The method of claim 1, further comprising removing any metal from the first dielectric material, using the one-or-more etching chambers, during the metal cap deposition step.

5. The method of claim 1, further comprising removing the first dielectric material from the barrier layer or metal caps during or after the first dielectric material deposition step.

6. The method of claim 1, further comprising removing the first dielectric material and/or the barrier layer from the metal caps after the first dielectric material deposition step.

7. The method of claim 1, wherein the metal caps comprise ruthenium, cobalt, tungsten, or molybdenum.

* * * * *